United States Patent [19]

El-Sharkawi et al.

[11] Patent Number: 5,180,963

[45] Date of Patent: Jan. 19, 1993

[54] OPTICALLY TRIGGERED HIGH VOLTAGE SWITCH NETWORK AND METHOD FOR SWITCHING A HIGH VOLTAGE

[75] Inventors: Mohamed A. El-Sharkawi, Renton; George Andexler, Everett; Lee I. Silberkleit, Mountlake Terrace, all of Wash.

[73] Assignee: Board of Regents of the University of Washington, Seattle, Wash.

[21] Appl. No.: 697,673

[22] Filed: May 9, 1991

Related U.S. Application Data

[63] Continuation-in-part of Ser. No. 665,774, Mar. 7, 1991, which is a continuation-in-part of Ser. No. 543,118, Jun. 22, 1990, abandoned.

[51] Int. Cl.$^5$ .................................................. G05F 1/70
[52] U.S. Cl. .................................... 323/211; 323/209; 323/210; 323/902; 307/633; 307/647
[58] Field of Search ............... 323/208, 209, 210, 211, 323/218, 902; 307/633, 647

[56] References Cited

U.S. PATENT DOCUMENTS 4,785,388  11/1988  Takahashi ...................... 323/902 X Primary Examiner—Emanuel T. Voeltz Attorney, Agent, or Firm—Christensen, O'Connor, Johnson & Kindness

[57] ABSTRACT

An optically triggered solid state switch and method for switching a high voltage electrical current. A plurality of solid state switches (350) are connected in series for controlling electrical current flow between a compensation capacitor (112) and ground in a reactive power compensator (50, 50') that monitors the voltage and current flowing through each of three distribution lines (52a, 52b and 52c), which are supplying three-phase power to one or more inductive loads. An optical transmitter (100) controlled by the reactive power compensation system produces light pulses that are conveyed over optical fibers (102) to a switch driver (110') that includes a plurality of series connected optical triger circuits (288). Each of the optical trigger circuits controls a pair of the solid state switches and includes a plurality of series connected resistors (294, 326, 330, and 334) that equalize or balance the potential across the plurality of trigger circuits. The trigger circuits are connected to one of the distribution lines through a trigger capacitor (340). In each switch driver, the light signals activate a phototransistor (300) so that an electrical current flows from one of the energy reservoir capacitors through a pulse transformer (306) in the trigger circuit, producing gate signals that turn on the pair of serially connected solid state switches (350).

26 Claims, 23 Drawing Sheets

OPTICALLY TRIGGERED HIGH VOLTAGE SWITCH NETWORK AND METHOD FOR SWITCHING A HIGH VOLTAGE

This invention was made with government support under Grant No. DEA179-87BP65584 awarded by the Department of Energy. The government has certain rights in the invention. The benefit of the filing dates of which are hereby claimed under 35 U.S.C. §1.20.

RELATED APPLICATIONS

This application is a continuation-in-part of prior pending U.S. application Ser. No. 07/665,774, filed Mar. 7, 1991, which in turn is a continuation-in-part of prior pending U.S. application Ser. No. 07/543,118, filed Jun. 22, 1990 now abandoned.

TECHNICAL FIELD

The invention generally pertains to switches used to selectively convey electrical current in respect to a high voltage, and more particularly, to an electrically isolated, solid state switch network that is controlled by light signals and to a method for switching an electrical current at a high voltage.

BACKGROUND OF THE INVENTION

A common problem on electrical power distribution systems supplying power to inductive loads is the need to provide reactive power compensation. Large motors and other types of inductive loads used, for example, in lumber mills, rock crushing plants, steel mills, and to drive elevators and pumps, shift the power factor of the system away from the desired unity level, thereby decreasing the efficiency of the power system. Compensation for the effects of inductive loads can be provided to control line voltage, power factor, or volt-ampere-reactive (VAR) power. Such compensation generally takes the form of capacitor banks that are connected to transmission and distribution lines. While an appropriate capacitive compensation can be determined and left on-line to compensate continuously running inductive loads, most inductive loads operate intermittently and cyclically, requiring that the correct compensation be selectively applied in response to a varying reactive load on the system. Mechanical contactors are typically employed to connect and switch the capacitor banks to compensate changing inductive loads. However, mechanical contactors are known to introduce undesirable transients each time that they operate to change the reactive compensation. Furthermore, being mechanical devices, mechanical contactors must be maintained, rebuilt, or even replaced after a limited number of operating cycles.

Other devices have been developed for controlling reactive power at the point of use, such as a power factor control system for induction motors developed by Frank J. Nola, which is described in U.S. Pat. No. 4,266,177. Unfortunately, there are several problems with the Nola control system that have prevented it from being widely used. For example, operational parameters of this type of device must be tailored for use with a specific inductive load. In addition, the Nola device can control power factor over only a limited range restricted to light loads, since the device will not work at full loads. Three Nola devices are required to control the power factor of a three-phase inductive load.

A reportedly transient-free, solid state automatic power factor correction apparatus is disclosed in U.S. Pat. No. 4,645,997. This apparatus is designed to automatically correct power factor in a multi-phase system, on the load side of a distribution transformer, e.g., to correct the power factor of an inductive load within a plant. It generates signals indicative of the voltage and current associated with each phase supplying power to the load. The current and voltage signals for each phase are compared to each other to determine the extent of current lag, and a signal indicative of current lag is generated for each line. A microprocessor-controlled circuit converts these signals into a lagging phase angle in degrees and determines the cosine of the angle and thus, the power factor of the line. The microprocessor also controls a switching network that is capable of selectively adding or removing banks of delta-connected capacitors to or from the power lines to control power factor. Only two silicon-controlled rectifiers (SCRs) comprise the switching network for each bank of capacitors. According to this patent, the SCRs can connect the capacitor banks to the lines at any time, regardless of the voltage on the capacitors, without creating current surges or electrical transients. However, this device is intended to operate at relatively low distribution transformer secondary voltage levels typically used in a plant i.e., 480 volts or less, and it cannot accurately determine the required reactive power compensation to control power factor if there are significant harmonics of the fundamental 60 Hz line frequency present in the current or voltage, since such harmonic distortion interferes with the measurement of the phase angle or lag time between voltage and current. In addition, the system disclosed in U.S. Pat. No. 4,645,997 lacks other features required for fully automated, unattended operation, such as the capability for remote control of the switching network and the ability to detect and compensate for malfunctions in the device. In any case, it is generally more effective for an electric utility to provide reactive power compensation on the lines of an electric power distribution system rather than depending on the customer to correct each load. The device disclosed in this patent cannot be used on distribution lines, because it cannot be controlled remotely, cannot operate unattended, and cannot operate at the higher voltages typically used on distribution lines (up to 35 KV).

In U.S. Pat. No. 4,645,364, which is issued to Williams and two of the inventors of the present invention, a reactive power compensating system is disclosed that is designed to directly compensate an inductive load on multi-phase lines of a distribution system. The apparatus includes fixed capacitors that are always connected to each phase of the system to provide a minimum reactive power compensation, and selectively switched capacitors that are connected to each phase by a solid state switching network of SCR and diode pairs to provide any additional compensation required. The required reactive power compensation for all phases is determined in the device by sensing the current on only one phase at the time its voltage crosses zero.

The reactive power compensation system described in the Williams et al. patent is deficient in several important respects. Since only one phase of a multi-phase distribution system is used to determine the required reactive power compensation for all of the phases, the system cannot properly compensate for different inductive demands on each of the phases resulting, for example, from various single phase and multi-phase inductive motors. Also, the determination of the required reactive power compensation is susceptible to errors caused by harmonic distortion in the line current and voltage—a problem that is specifically admitted in the patent. In some situations, use of a fixed capacitance to provide a minimum required compensation may be inappropriate, since, if all of the significant inductive loads connected to the system are at times de-energized, the correct compensation may be much less than that provided by the fixed capacitance. Furthermore, fault tolerance and operation of the switching network in the presence of voltage transients and harmonics are not addressed in this reference.

In consideration of the above-noted problems that exist with the prior art systems used to compensate for inductive loads, a reactive power compensation system is herein described that compensates for different inductive loads on each phase. It is an object of the present invention to provide a switch and a method for selectively connecting an appropriate capacitance to provide the compensation required for the inductive load on each phase of an electrical power distribution system. More generally, it is an object of the present invention to provide an optically triggered solid state switch and a method for selectively controlling the flow of an electrical current at a high voltage without introducing transients or harmonic distortion in that electrical current. These and other objects and advantages of the present invention will be apparent from the attached drawings and from the Description of the Preferred Embodiments that follows.

SUMMARY OF THE INVENTION

The present invention is an optically triggered solid state switch. One embodiment of this switch includes energy storage means, connectable to a voltage source, for conveying an electrical current and for storing an electrical charge resulting from the electrical current. Transformer means are connected generally in parallel with the energy storage means and are operative to produce a trigger pulse in response to a pulse of electrical current flowing through the transformer means from the electrical charge stored by the energy storage means. Light sensitive means are connected generally between the energy storage means and the transformer means and are operative to controllably discharge the electrical charge stored by the energy storage means in response to a pulse of light, thereby producing the pulse of electrical current flowing through the transformer means. Triggered switch means, which are connected to the transformer means, provide a conductive path for an electrical current to flow in respect to the voltage source, in response to the trigger pulse.

The voltage source can be a periodically varying potential. The optically triggered solid state switch includes a trigger capacitor that is connected to the energy storage means and is connectable to the voltage source. The trigger capacitor charges to a peak potential of the voltage source as the electrical current flows through the energy storage means.

The energy storage means comprise an energy storage capacitor that stores the electrical charge, charging path means for conveying the electrical current that provides the electrical charge stored on the energy storage capacitor, and at least one diode. The diode(s) is connected in series with the energy storage capacitor so as to carry the electrical current in one direction.

The transformer means comprise a primary winding that is connected to the energy storage means, and a secondary winding that is connected to the triggered switch means. The triggered switch means comprise a silicon controlled rectifier and a diode connected in parallel with each other, the silicon controlled rectifier having a gate that is connected to the transformer means to receive the trigger pulse. In response to the trigger pulse, the silicon controlled rectifier begins conducting the electrical current. The diode is connected to carry an electrical current in an opposite direction from the silicon controlled rectifier.

The light sensitive switch means comprise a phototransistor having a collector and an emitter connected to the energy storage means, and a transistor controlled by the phototransistor. Thus, in response to the phototransistor, the transistor conducts electrical current that flows through the transformer means.

A plurality of optically triggered solid state switches are connectable in series to the voltage source to provide the conductive path if the voltage source exceeds a peak voltage rating of a single optically triggered solid state switch. The plurality of optically triggered solid state switches thereby are capable of interrupting the electrical current flow from the voltage source when the triggered switch means stop conducting.

The optically triggered solid state switch can further comprise snubber means for protecting the triggered switch means from transient voltages in excess of the peak voltage rating, and means for providing the light pulse to the light sensitive switch means.

In one form of the invention, the triggered switch means are connected to provide the conductive path between a ground connection and a capacitor that is connected to the voltage source.

A further aspect of this invention relates to a method for selectively switching an electrical current at a periodically varying high voltage. The steps comprising the method are generally consistent with the functions of the elements comprising the optically triggered solid state switch described above.

DESCRIPTION OF THE PREFERRED EMBODIMENTS

PC Controlled Reactive Power Compensator

Figure 1:
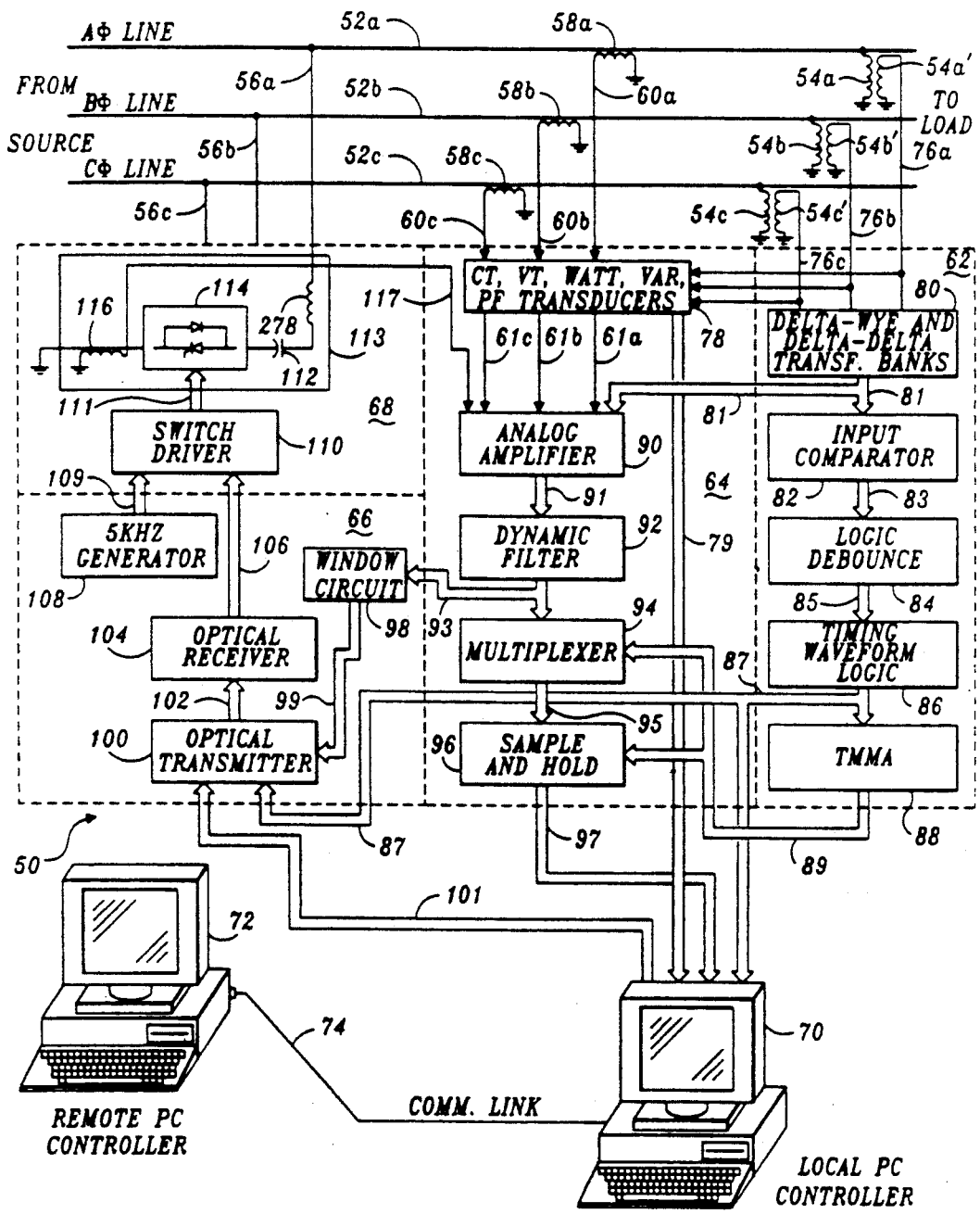
FIG. 1 is a schematic block diagram of a first embodiment of the reactive power compensator.

Referring to FIG. 1, a first embodiment of the reactive power compensator is shown generally at reference numeral 50. In the application of the present invention illustrated therein, reactive power compensator 50 determines an appropriate compensation capacitor to apply to lines 52a, 52b, and 52c, which are connected to one or more inductive loads (not shown). Lines 52 carry three-phase electrical current from a remote generator or other three-phase source (not shown). The voltage on lines 52 is monitored by corresponding voltage transformers (VTs) 54. Similarly, current transformers (CT's) 58 are used to monitor the electrical current flowing from the source to each load through lines 52. Reactive power compensator 50 separately monitors the voltage and current on each phase and separately determines an appropriate capacitance to compensate for the inductive load(s) connected to each phase, which may differ between the phases. Compensation capacitors 112 are electrically connected to each line 52 via lines 56. These capacitors can selectively be connected to neutral or ground via a solid state switching circuits 114 to provide reactive power compensation. Reactive power compensator 50 can selectively be operated in a manual mode in which a local or remote operator determines the specific compensation capacitors that are connected to provide compensation on lines 52, or it can be operated in an automatic mode in which the reactive power compensator determines the specific compensation capacitors that must be connected to achieve a user-selected or predetermined volt-ampere-reactive (VAR) level on the line. Alternatively, reactive power compensator 50 can selectively be used to automatically maintain a predetermined voltage, or a predetermined power factor (PF) on each line 52, or can provide reactive power compensation or predetermined line voltage based upon a time schedule.

The mode in which reactive power compensator 50 operates is selectively determined by the operator of the device by commands entered in a local personal computer (PC) controller 70. In addition, local PC controller 70 can optionally monitor, record, and display data corresponding to the output signals from conventional watt, VAR, and power factor (PF) transducer within an instrumentation bank 78, which are carried on data leads 79. These signals are not used for determining the reactive power compensation, but can be provided by transducers that use the same voltage and current signals required by the reactive power compensator. For example, as shown in FIG. 1, CTs 58a, 58b, and 58c, are connected to monitor the electric current flowing in lines 52a, 52b, and 52c, respectively, producing secondary current signals on leads 60a, 60b, and 60c, which are indicative of the actual current in lines 52. Transducer instrumentation bank 78 is connected to leads 60. Thus, secondary current from CTs 58 flows through each transducer requiring a secondary current signal indicative of electric current flowing in lines 52, and on into leads 61 for use in determining the required reactive power compensation. Likewise, potential signals from voltage transformers 54 are connected to transducer instrumentation bank 78. Signals from these current and voltage transformers are used by reactive power compensator 50 for determining the appropriate reactive power compensation as described below.

An optional remote PC controller 72 can be connected to local PC controller 70 by a communications link 74 to control reactive power compensator 50 from the location where remote PC controller 72 is installed. For example, electric utilities often provide a central control facility for their distribution system from which an operator can monitor and control the equipment connected to the distribution lines. Remote PC controller 72 may thus comprise a relatively large computer that controls power switches and other devices.

Reactive power compensator 50 includes a synchronization block 62 in which timing signals are derived from the potential signals supplied by voltage transformers 54 for use in controlling the reactive power compensator. Signals indicative of the current and the potential on lines 52 are amplified and filtered in a conditioning block 64. Local PC controller 70 uses the timing signals and the signals indicative of current and potential on lines 52 to determine an appropriate reactive power compensation for each line 52 and produces control signals that are supplied to a plurality of triggering blocks 66. Triggering blocks 66 respond to the control signals in developing triggering signals that are input to a plurality of switching blocks 68 and cause an appropriate reactive power compensation capacitance to be connected to each line 52. Only one triggering block 66 and one switching block 68 are shown in FIG. 1.

Voltage transformers 54 include primary windings 54a, 54b, and 54c, respectively, each of which are connected between the corresponding line 52a, 52b, and 52c and ground. These voltage transformers include secondary windings 54a', 54b', and 54c', which are, respectively, connected to leads 76a, 76b, and 76c. A signal corresponding to the voltage on each of lines 52 is thus supplied to transducer instrumentation bank 78 and to Delta-Wye and Delta-Delta transformer banks 80. At rated voltage on lines 52, the potential signal supplied through leads 76 is nominally 120 V AC. Delta-Wye and Delta-Delta transformer banks 80 comprise either two three-phase voltage transformer banks or six voltage transformers connected in Delta-Wye and Delta-Delta configurations, producing a relatively low voltage output signal (less than 20 V AC) that is conveyed over leads 81 to an input comparator circuit 82 and an analog amplifier circuit 90. The six potential signals produced by Delta-Wye and Delta-Delta transformer banks 80 respectively correspond to the line-to-neutral periodic sinusoidal voltage waveforms on A phase (line 52a), B phase (line 52b), and C phase (line 52c), and to the line-to-line voltages AB, BC, and CA.

Figure 2:
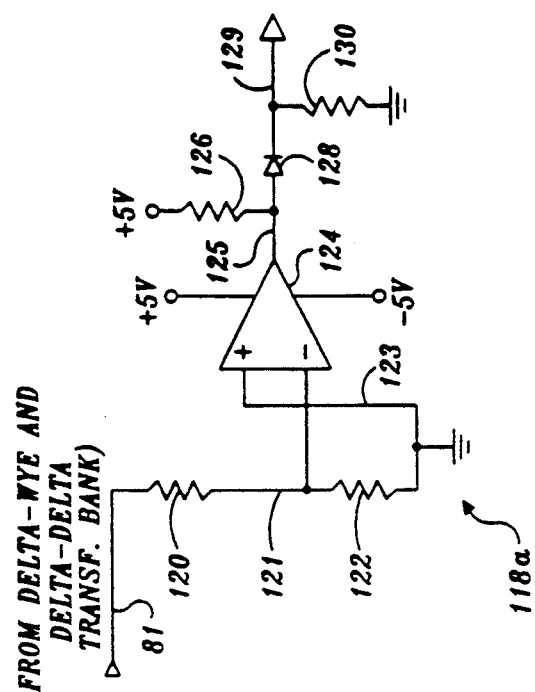
FIG. 2 is an electrical schematic diagram showing a comparator circuit that is typical of those used in an input comparator block of the reactive power compensator of FIG. 1.

FIG. 2 illustrates a comparator 118a that is used in the input comparator circuit 82. This circuit is typical of the six comparator circuits supplied potential signals from Delta-Wye and Delta-Delta transformer banks 80. As shown in FIG. 2, an input potential signal on lead 81 is applied to two resistors 120 and 122, which are connected in series by a conductor 121. Resistor 122 is connected to ground so that the two resistors divide the voltage of the input signal, producing a lower level potential signal that is applied by conductor 121 to the inverting input of a comparator 124. The non-inverting input of comparator 124 is connected to ground through a lead 123 and the comparator output is connected by a lead 125 to the anode of a diode 128 and to one end of a resistor 126. The opposite end of resistor 126 is connected to +5 V DC. A lead 129 is connected to the cathode of diode 128 and is referenced to ground via a resistor 130. The sinusoidal potential signal applied to the inverting input of comparator 124 produces a corresponding square wave ranging between −5 volts and +5 volts in amplitude. However, due to the +5 V DC level applied through resistor 126 and diode 128, the output signal on lead 129 is a square wave ranging between approximately 0 volts and +5 volts.

Referring back to FIG. 1, the six square wave signals produced by input comparator circuit 82 are conveyed through leads 83 to a logic debounce circuit 84 that cleans up any jitter or noise present on their leading and trailing edges, which can occur at each zero crossing of the potential signal input to comparator 124. Details of a debounce circuit 132, which is typical of the two such circuits comprising logic debounce circuit 84, are shown in FIG. 3.

Figure 3:
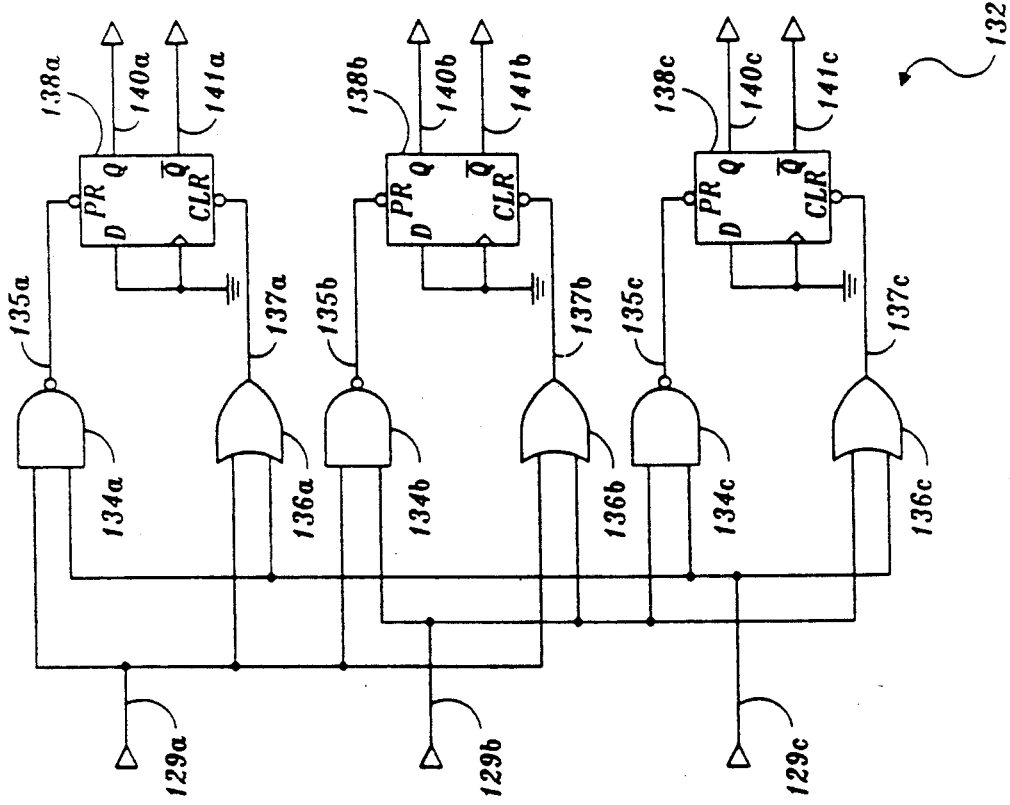
FIG. 3 is an electrical schematic diagram of a logic debounce circuit that is typical of two such circuits in the first embodiment.

Turning now to FIG. 3, three leads 129a, 129b, and 129c, respectively carry square wave signals (possibly having noise on their leading and trailing edges) that correspond to the voltage waveforms on A phase, B phase, and C phase. Thus the square waves are at +5 V DC during the positive half cycle of the voltage waveforms and at zero during the negative half cycles. Lead 129a is connected to one of two inputs of NAND gates 134a and 134b and to one of two inputs of OR gates 136a and 136b. Similarly, lead 129b is connected to one input of NAND gates 134b and 134c and to one input of OR gates 136b and 136c; and lead 129c is connected to the other input of NAND gates 134a and 134c and to the other input of OR gates 136a and 136c. Debounce circuit 132 also includes three D flip flops 138a, 138b, and 138c that have their D and clock inputs grounded. Each of NAND gates 134a, 134b, and 134c are connected by leads 135a, 135b, and 135c to the inverted preset input of the three D flip flops, respectively. Likewise, the outputs of OR gates 136a, 136b, and 136c are connected to the inverted clear inputs of the D flip flops via leads 137a, 137b, and 137c, respectively.

A logic level 0 applied to the inverted preset inputs of the D flip flops causes their Q output to have a logic level 1, and a logic level 0 on the inverted clear input causes the Q output to have a logic level 0 value. Elimination of any jitter present on the leading and trailing edges of the square wave signals carried on leads 129 occurs as follows. When the incoming square wave signal on lead 129a (A phase) first rises to a logic level 1 (at the leading edge of the square wave) the square wave signal on lead 129c (C phase) will already be at a logic level 1. A logic level 0 is thus output from NAND gate 134a and is applied to the inverted preset of D flip flop 138a, causing its Q output to lock at a logic level 1 and its $\overline{Q}$ output to lock at a logic level 0. The square wave signal on lead 129c (C phase) then drops to a logic level 0. The first time that the square wave signal on lead 129a drops to zero (the trailing edge of the square wave signal) OR gate 136a will produce a logic level 0 output, causing the Q output of D flip flop 138a to lock at logic level 0. D flip flops 138b and 138c operate in a similar manner to provide clean digital signals (square wave signals) corresponding to one half period of the potential signal on B phase and C phase, respectively. Although not shown in FIG. 3, a second debounce circuit of identical design is used to eliminate jitter at the leading and trailing edges of the square wave signals corresponding to AB, BC, and CA potential signals.

Figure 4A:
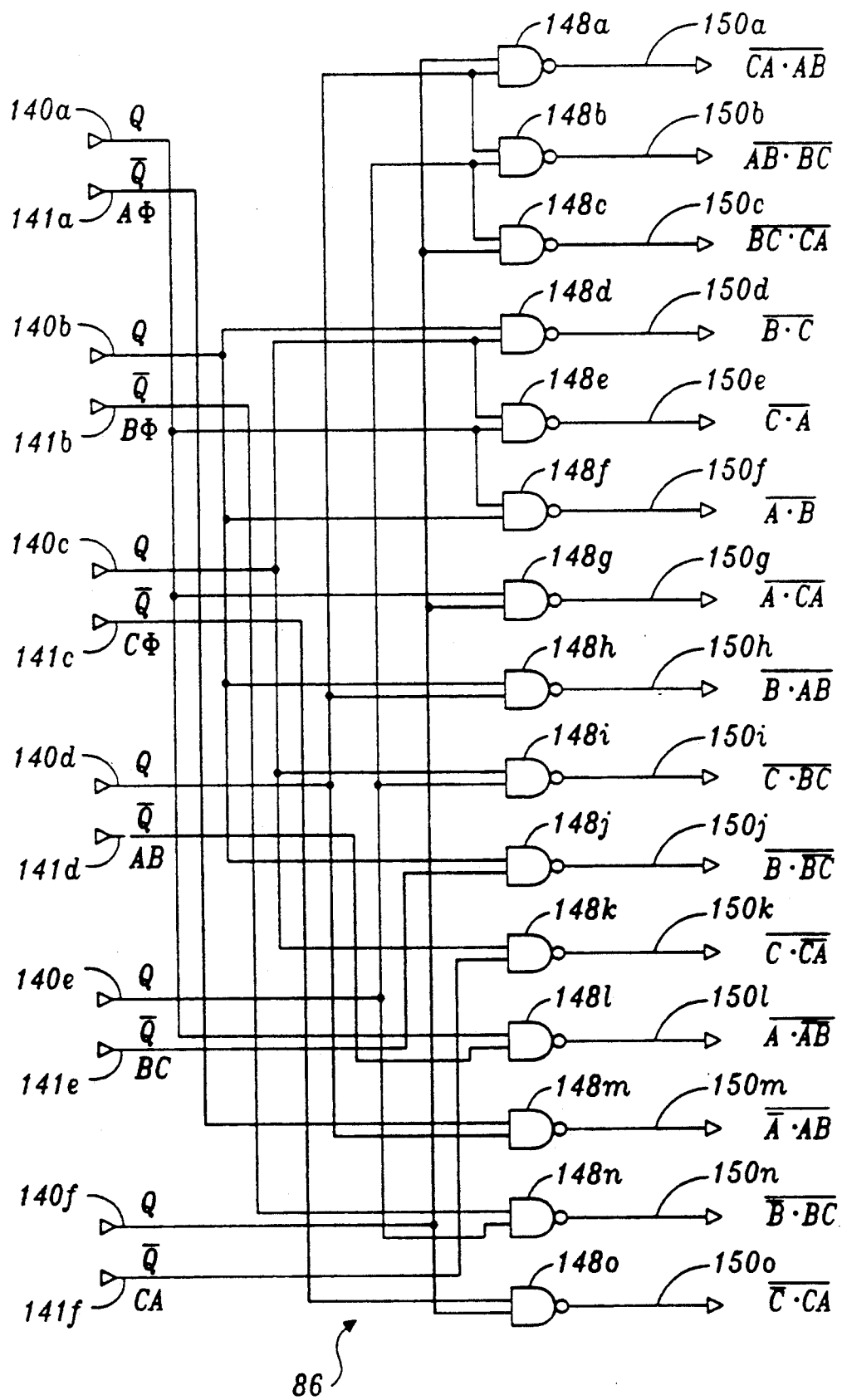
FIG. 4A is an electrical schematic diagram of a timing logic circuit used in the first embodiment of the reactive power compensator.

The Q and $\overline{Q}$ logic level signals output from logic debounce circuits 84 are conveyed through leads 140 and 141 (collectively, leads 85) to a timing waveform logic circuit 86 (see FIG. 1), which is shown in detail in FIG. 4A. Timing waveform logic circuit 86 includes 15 NAND gates 148a through 148o, each of which have two inputs that are connected to leads 140 and 141 on which are respectively conveyed the Q and $\overline{Q}$ square wave signals output from logic debounce circuit 84. Specifically, the signal on lead 140a is connected to one input of NAND gate 148e, 148g, 148l. The Q, or inverted, version of this signal is conveyed on a lead 141a to one input of NAND gate 148m. The signal for B phase (the Q output) is conveyed by a lead 140b to one input of NAND gates 148d, 148f, 148h, and 148j. The inverted form of this signal is conveyed by a lead 141b to NAND gate 148n. For C phase, the signal on lead 140c is connected to NAND gates 148d, 148i, and 148k. The inverted form of this signal is conveyed by a lead 141c to NAND gate 148o. For AB phases, a lead 140d conveys the signal from the debounce circuit to NAND gates 148a, 148h, and 148m. The corresponding inverted signal is conveyed by a lead 141d to NAND gate 148*l*. The signal on lead 140*e* for BC phases is input to NAND gates 148*b*, 148*i*, and 148*n*. The inverted form of this signal is applied via a lead 141*e* to NAND gate 148*j*. A lead 140*f* conveys the signal for CA phases to NAND gates 148*a*, 148*c*, 148*g*, and 148*o*. The inverted form of this signal is applied through a lead 141*f* to NAND gate 148*k*.

Figure 4B:
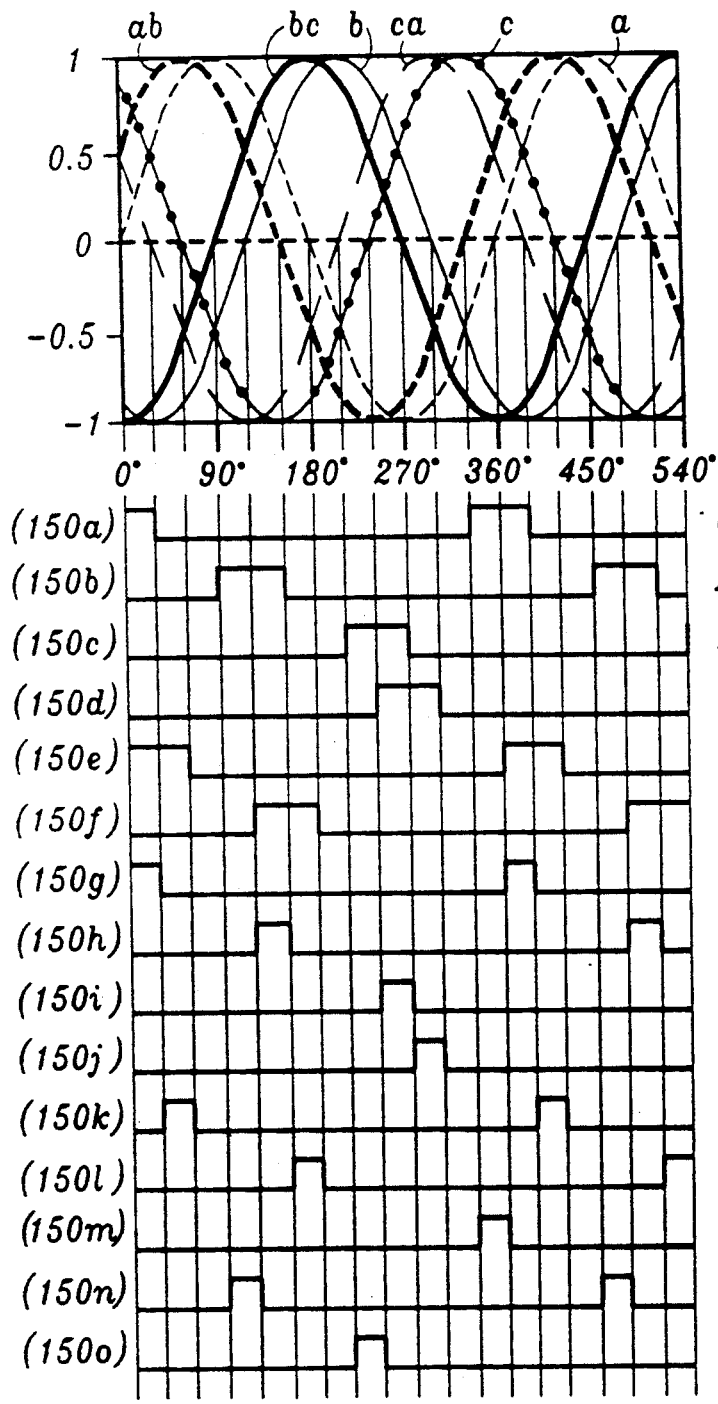
FIG. 4B is a diagram illustrating the relationship between six voltage waveforms that are used to produce timing signals in the first embodiment.

Leads 150*a* through 150*o* carry the signals output from NAND gates 148*a* through 148*o*, respectively. As illustrated in FIG. 4B, these signals comprise logic levels that change from low to high during intervals that extend over integral numbers of 30° increments, e.g., for 30°, 60°, 90°, etc., of a 60 Hz waveform. In FIG. 4B, the normalized voltage waveforms corresponding to the six potential signals are shown in respect to the inverted logic level for the signals on leads 150*a* through 150*o*. Rather than showing the actual form of these signals on leads 150, FIG. 4B illustrates the signals after they go through an additional stage of inversion, which occurs in a TMMA circuit 88 (FIG. 1). These signals are used for timing, e.g., to define time intervals around the zero crossing for each of the three-phase voltage waveforms and around the negative peak of those waveforms. For example, the timing signals shown in the first three lines of FIG. 4B define a 60° interval centered about the point at which the voltage waveform for each of the three phases crosses zero. The period occurring 30° prior to the zero crossing for A phase is identified as "$I_{am1}$" and the 30° interval that immediately follows is identified as "$I_{am2}$." In this notation, the "I" refers to current, "a" refers to A phase, and "m1" and "m2" respectively refer to the first and second periods associated with multiplexed current measurements preceding and following the voltage waveform zero crossover point.

The timing signals on leads 150*d*, 150*e*, and 150*f* define 60° intervals centered around the negative peaks of each of the voltage waveforms for the A, B, and C phases. The notation identifies these three signals as multiplexed measurements of voltage occurring in a first and second interval centered about the negative peak of each of the illustrated three-phase voltage waveforms. For example, the signal on lead 150*d* is referred to as "$V_{am1}+V_{am2}$," the "V" identifying a voltage measurement; the other terms in the notation have already been explained.

The signals on leads 150*g*, 150*h*, and 150*i* represent 30° intervals occurring immediately before the negative peak for the three-phase voltage waveforms B, C, and A, respectively. These timing signals are referred to by notation indicating that they are used to control sampling of the voltage on each phase. Similarly, the signal on leads 150*m*, 150*n*, and 150*o* identify 30° time intervals occurring 30° before each of the zero voltage crossovers for A, B, and C phases, respectively. The notation used with each of these three signals indicates that they are used in connection with sampling current on each of the three phases. For example, the signal on lead 150*m* is identified with the notation "$I_{as}$," wherein "I" indicates a current measurement, "a" indicates A phase, and "s" indicates a sample and hold timing signal.

Figure 5:
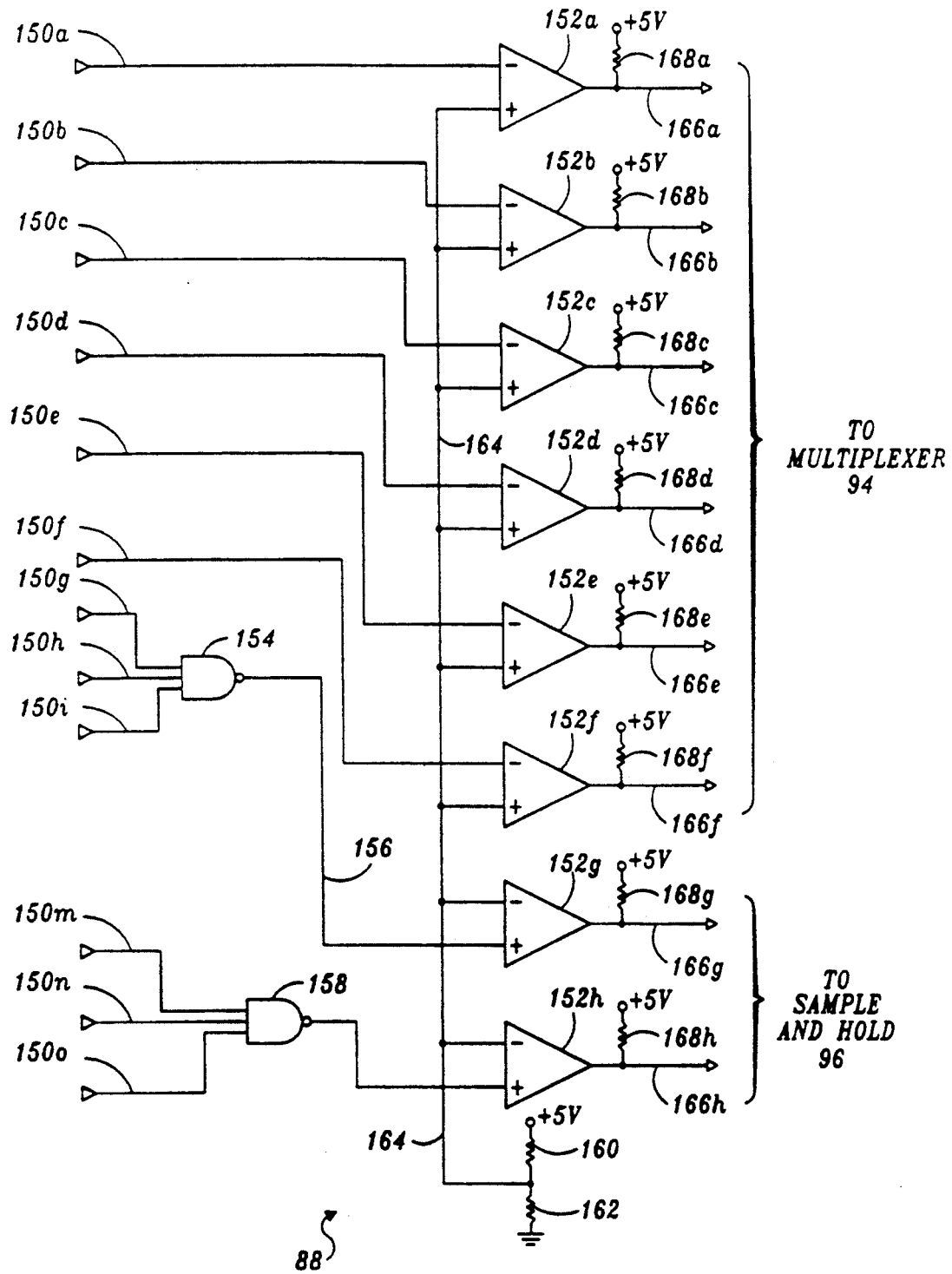
FIG. 5 is an electrical schematic diagram of a TTL/MOS match and amplifier (TMMA) circuit.

The signals on leads 150 (collectively shown in FIG. 1 as leads 87) are input to TMMA circuit 88, details of which are shown in FIG. 5. TMMA circuit 88 includes eight comparators 152*a* through 152*h*. Leads 150*a* through 150*f* are connected to the inverting input of comparators 152*a* through 152*f*, respectively. The non-inverting input of each of these comparators is connected by a lead 164 to the common node between two series-connected, equal value resistors 160 and 162. Resistors 160 and 162 are connected between +5 V DC and ground so that their common node to which lead 164 is attached is at a potential of approximately 2.5 V DC.

Leads 150*g* through 150*i* are connected to the three inputs of a NAND gate 154, the output of which is connected to the non-inverting input of a comparator 152*g* through a lead 156. Similarly, leads 150*m* through 150*o* are connected to the three inputs of a NAND gate 158 that has an output connected to the non-inverting input of a comparator 152*h*. The inverting inputs of comparators 152*g* and 152*h* are connected to the 2.5 V DC potential on lead 164.

The outputs of comparators 152*a* through 152*h* connect to leads 166*a* through 166*h*, respectively, and are thus connected to one end of pull-up resistors 168*a* through 168*h*, the opposite ends of which connect to +5 V DC. Accordingly, comparators 152*a* through 152*h* convert the logic level signals at their inputs, which range between 0 and 5 V DC, to signals that range between −5 and +5 V DC. Since NAND gate 154 and NAND gate 158 invert the logic sense of the timing signals respectively applied to their inputs, the output of these NAND gates are connected to the non-inverting input of comparators 152*g* and 152*h* for comparison against 2.5 V DC. The signals output from comparators 152*g* and 152*h* are supplied on leads 166*g* and 166*h* to a sample and hold circuit 96. As shown in FIG. 1, leads 166 comprise leads 89.

The timing signal output on lead 166*g* includes three 30° pulses used to control the sample and hold of potential signals for the three phases, i.e., to determine when to hold a value corresponding to the negative peak voltage on each of the three phases A, B, and C. Similarly, the three pulses comprising the timing signal output from comparator 152*h* on lead 166*h* is used to determine the time at which current is to be measured for each of the three phases, where that time corresponds to the zero crossing of the corresponding potential waveform for each line 52. The signals on leads 166*a* through 166*f* are input to a multiplexer 94 (see FIG. 1) over leads 89 to control the selection of signals indicative of current and potential on each of the three phases A, B, and C, so that the appropriate signal is output from multiplexer 94 to sample and hold circuit 96 via leads 95. The timing signals applied to multiplexer 94 from TMMA circuit 88 cause the selected potential or current signal from the multiplexer's input signals to be output from the multiplexer over leads 95 starting 30° before the negative peak voltage occurs, and 30° before the zero voltage crossing of the voltage waveform, respectively. Thus, the appropriate multiplexed potential or current signal is applied to sample and hold circuit 96 well ahead of the point in time at which a value sampled is to be held and supplied to local PC controller 70 over a lead 97. Details of the multiplexer and of the sample and hold circuit are not shown, since they are generally conventional and are well known to those of ordinary skill in this art.

Before the signals indicative of current and voltage on each of the three phases (lines 52) are supplied to multiplexer 94 and then to sample and hold circuit 96, as shown in FIG. 1, these signals first pass through analog amplifier circuit 90. Signals from the analog amplifier circuit are conveyed via leads 91 to a dynamic filter 92, which filters out harmonic distortion.

Figure 6:
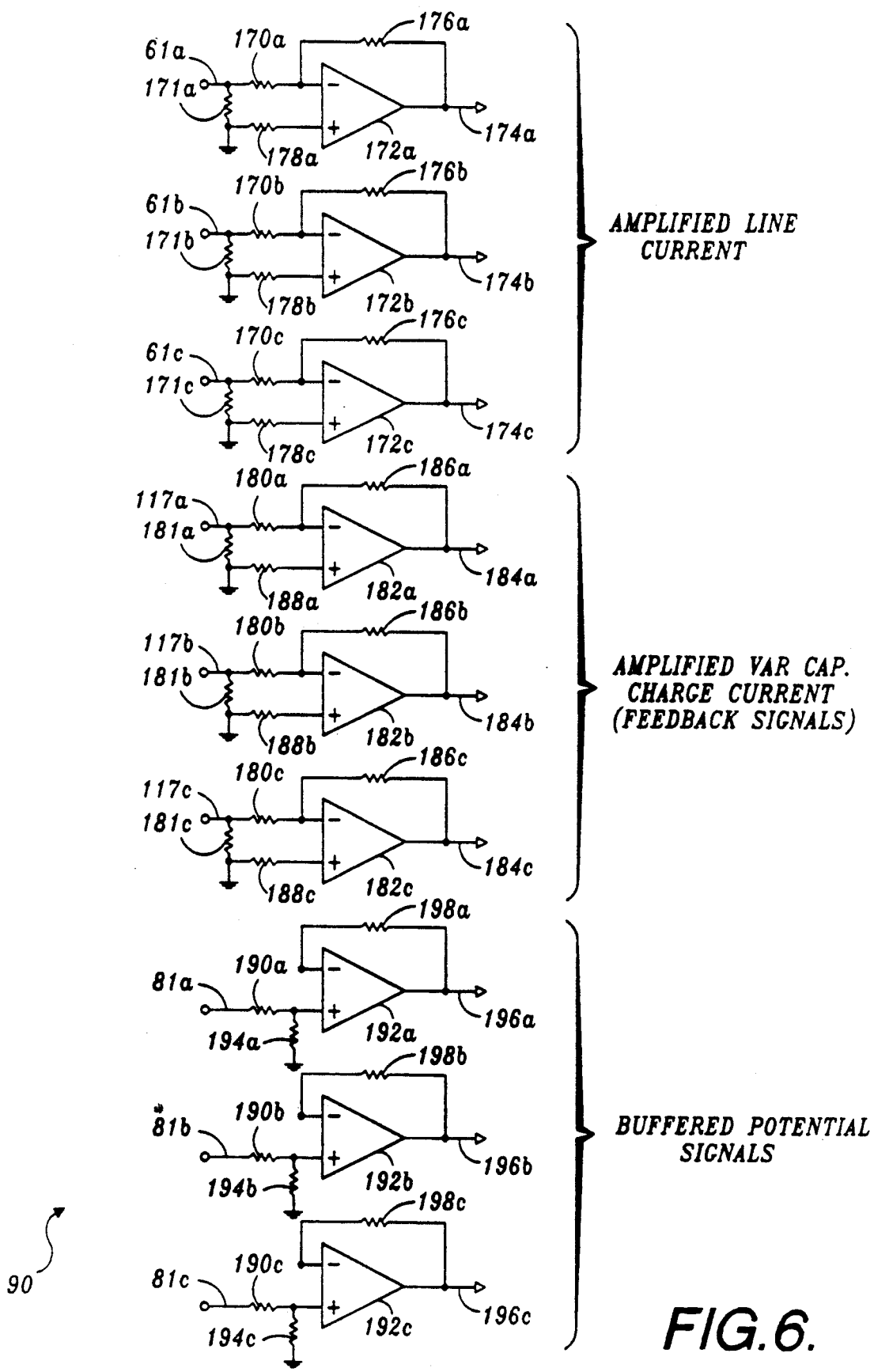
FIG. 6 schematically illustrates an analog amplifier circuit used to buffer and/or amplify signals in a signal-conditioning block of the present invention.

Details of analog amplifier circuit 90 are shown in FIG. 6. The secondary currents from current transformers 58a, 58b, and 58c flow through leads 61a, 61b, and 61c, respectively, to shunt resistors 171a, 171b, and 171c. These shunt resistors are relatively low-valued resistors that are connected to ground. The potential developed across the shunt resistors is conveyed through input resistors 170a, 170b, and 170c, respectively, to the inverting input of operations amplifiers (OP amps) 172a, 172b, and 172c; the non-inverting inputs of these OP amps are connected through resistors 178a, 178b, and 178c to ground. Feedback resistors 176a, 176b, and 176c determine the gain of OP amps 172a through 172c (in respect to the resistance of input resistors 170). Op amps 172 thus produce amplified current signals corresponding to the electrical currents on each of A, B, and C phases (lines 52), and these current signals are carried on leads 174a, 174b, and 174c.

Similarly, leads 117a, 117b, and 117c each conduct a feedback signal indicative of the charge current for the compensation capacitors 112 connected to the three phases, which represents the reactive power compensation actually being provided to each phase. These feedback signals are applied across shunt resistors 181a, 181b, and 181c, respectively. The potential developed across these three shunt resistors are applied to the inverting input of OP amps 182a, 182b, and 182c through input resistors 180a, 180b, and 180c, respectively. The non-inverting inputs of OP amps 182 are connected to ground through resistors 188a, 188b, and 188c. Feedback resistors 186a, 186b, and 186c provide a desired gain. The amplified feedback signals from OP amps 182 are carried on leads 184a, 184b, and 184c.

The three signals indicative of the voltage on A, B, and C phases developed by voltage transformer secondary windings 54a', 54b', and 54c', are supplied through leads 81a, 81b, and 81c to the non-inverting inputs of OP amps 192a, 192b, and 192c through input resistors 190a, 190b, and 190c. The non-inverting inputs of the OP amps are referenced to ground through resistors 194a, 194b, and 194c. Feedback resistors 198a, 198b, and 198c connect output leads 196a, 196b, and 196c of these OP amps back to their inverting input. OP amps 192 are thus configured to buffer the potential signals developed by the three voltage transformers connected to the distribution lines. Leads 174, 184, and 196 collectively comprise leads 91, which convey the buffered potential signals to dynamic filter 92.

Figure 7:
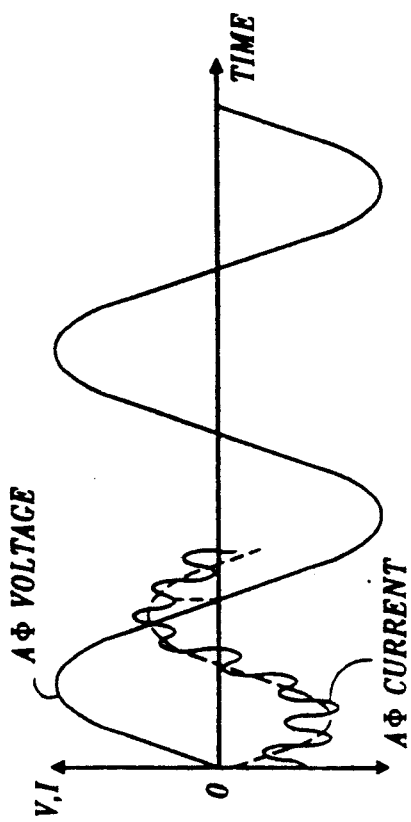
FIG. 7 is a graph showing several cycles of a potential signal and a cycle of a distorted current signal, illustrating the effect of harmonic distortion on the determination of the reactive power compensation required for each phase.

In determining the required reactive power compensation, or power factor for each phase, the current flowing through each of lines 52 is measured when the potential on that line crosses zero. Any harmonic distortion in the current flowing in each of the lines 52 is reflected in the current signals, which are output from amplifier circuit 90. Such distortion can introduce an error in the determination of the required reactive power compensation or power factor for each phase as shown in FIG. 7. In this Figure, the potential and current for a single phase are shown. As will be apparent from this illustration, the instantaneous value of current in the distorted waveform when the potential waveform crosses zero can be substantially greater or less than the actual value for current at the fundamental frequency, which is represented by a dashed line in this Figure. Distortion of the potential signal indicative of voltage on each phase can have a similar effect on accuracy. Accordingly, it is important to filter the signals indicative of current and potential on each phase to eliminate the effect of harmonic distortion, so that the required reactive power compensation can be accurately determined.

Figure 8:
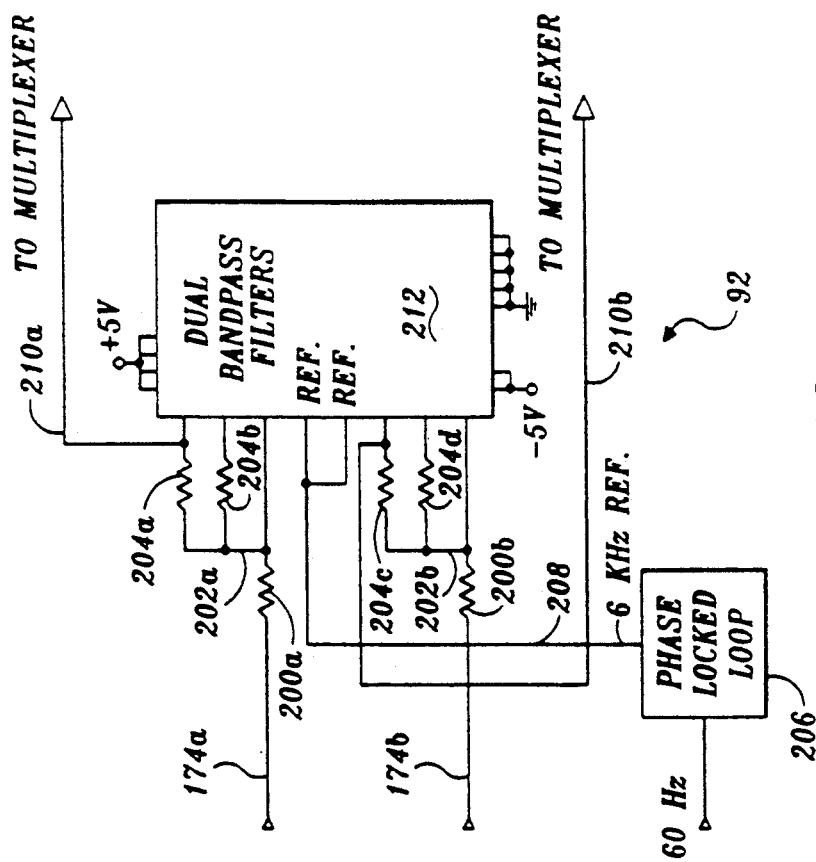
FIG. 8 is an electrical schematic diagram of a typical dual filter circuit used to filter out harmonic distortion.

FIG. 8 illustrates part of the circuit used in dynamic filter 92 to substantially eliminate any harmonic distortion on the current and potential signals output from amplifier circuit 90. The signals indicative of current flowing on A phase and B phase are conveyed via leads 174a and 174b, respectively, which are connected to input resistors 200a and 200b. These two resistors are connected to the two inputs of a dual bandpass filter 212, which is one of five such filters used in the dynamic filter. The other dual bandpass filters are configured generally as shown in FIG. 8 and are used to filter the remaining current and potential signals for each phase.

In the preferred embodiment, a Motorola TM type MF10CCN switched capacitor filter integrated circuit is used for dual bandpass filter 212; however, other filter circuits could be used for this purpose. The "Q" and other characteristics of each section of dual bandpass filter 212 are determined by resistor networks comprising resistors 204a/204b and 204c/204d. One end of resistors 204a and 204b is connected to one side of resistor 200a via a lead 202a, and their opposite ends are connected to the first section of dual bandpass filter 212. Resistors 204c and 204d are similarly connected to resistor 200b via lead 202b and to the second filter section. Switched capacitance filters, such as dual bandpass filter 212, require that a reference signal be supplied having a frequency equal to 100 times the center frequency of the pass band. Each section of the dual bandpass filter is therefore provided with a 6 kHz reference frequency signal over a lead 208, preferably from a phase-locked loop circuit 206. The phase-locked loop circuit is synchronized to the 60 Hz line frequency of lines 52 and thus tracks line frequency fluctuations on the lines.

The filtered output signals from dual bandpass filter 212 are input to multiplexer 94 over leads 210a and 210b; collectively, all of the output signals from dynamic filter 92 are input to multiplexer 94 over leads 93. Due to the use of dynamic filter 92, reactive power compensator 50 is substantially unaffected by harmonic distortion present on the current and potential on lines 52, and therefore, can more accurately determine the reactive power compensation required on each phase and by monitoring the filtered feedback signals, can determined if the compensation capacitors 112 are operating properly to provide the expected compensation.

The timing signals supplied multiplexer 94 from TMMA circuit 88 over leads 89 causes the multiplexer to select one of the filtered current and potential signals at its input for sampling 30° before that signal is to be sampled and held by sample and hold circuit 96. In addition, the timing signals applied to sample and hold circuit 96, also over leads 89, define the time at which the selected multiplexed signal output by multiplexer 94 is sampled and supplied to local PC controller 70 over leads 97. The local PC controller includes a plug-in card (not shown) that performs an 8-bit analog-to-digital (AD) conversion of each signal supplied by sample and hold circuit 96, enabling a local PC controller to compute the required reactive power compensation for each phase, based upon the magnitude of the line current at the time the potential signal on that phase crosses zero. Since timing signals for this operation are all supplied by TMMA circuit 88, local PC controller 70 need only determine the appropriate compensation capacitor(s)

that must be connected to each of the respective lines 52 to provide the computed compensation and supply the control signals that effect connection of those selected compensation capacitors to the lines.

Compensation capacitors 112 are only connected to compensate one of lines 52 when the potential on the line reaches a peak value. The control signals for selecting specific compensation capacitors that are connected at this time are supplied by local PC controller 70 over leads 101 to an optical transmitter 100, which comprises part of triggering block 66. The timing signals that determine when the compensation capacitors selected by local PC controller 70 are connected to each of the lines 52 (preferably at the negative peak voltages so that initial current flow through switch circuits 114 is zero as the switch circuits are first turned on) are supplied to optical transmitter 100 by the timing waveform logic circuit 86 over leads 87.

Figure 9:
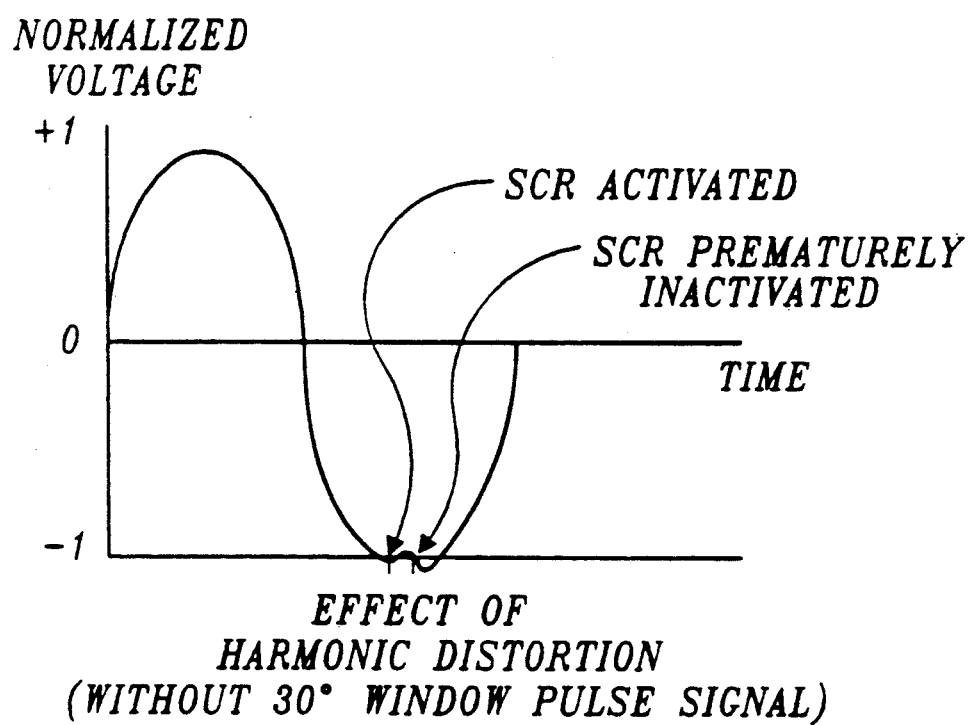
FIG. 9 is a graph illustrating harmonic distortion in the voltage waveform on one phase.

Connection of each of the compensation capacitors 112 to lines 52 is effected as described below, using switch circuit 114, which comprises pairs of silicon-controlled rectifiers (SCRs) and diodes, as shown schematically in FIG. 1. Once gated into conduction, the SCRs continue to carry charge current to the capacitor so long as the direction of current flow through the SCRs does not change. However, transient and/or harmonic distortion in the voltage on each of lines 52 can cause the SCRs to briefly conduct charge current to the compensation capacitors, but to prematurely stop conducting in response to a reverse bias voltage across the SCRs due to system voltage harmonics. This condition is illustrated in FIG. 9. As the distorted potential signal reaches the nominal negative peak, the SCRs are gated on to enable the flow of charge current in respect to a compensation capacitor 112; however, when the potential decreases from its nominal peak value, the SCRs turn off, prematurely disconnecting the compensation capacitor prematurely from the line. To prevent this condition, a window circuit 98 is included in triggering block 66 for each phase, as shown in FIG. 1. Window circuit 98 receives an inverted and filtered potential signal indicative of the voltage on one of the phases from dynamic filter 92 through lead 93. Using this potential signal, a "window pulse" signal is produced that insures proper operation of switch circuits 114. (The output of window circuit 98 comprises a pulse that is 30° in width and is referred to as a window pulse signal.) The window pulse signal starts just before the negative peak voltage on lines 52.

Figure 10:
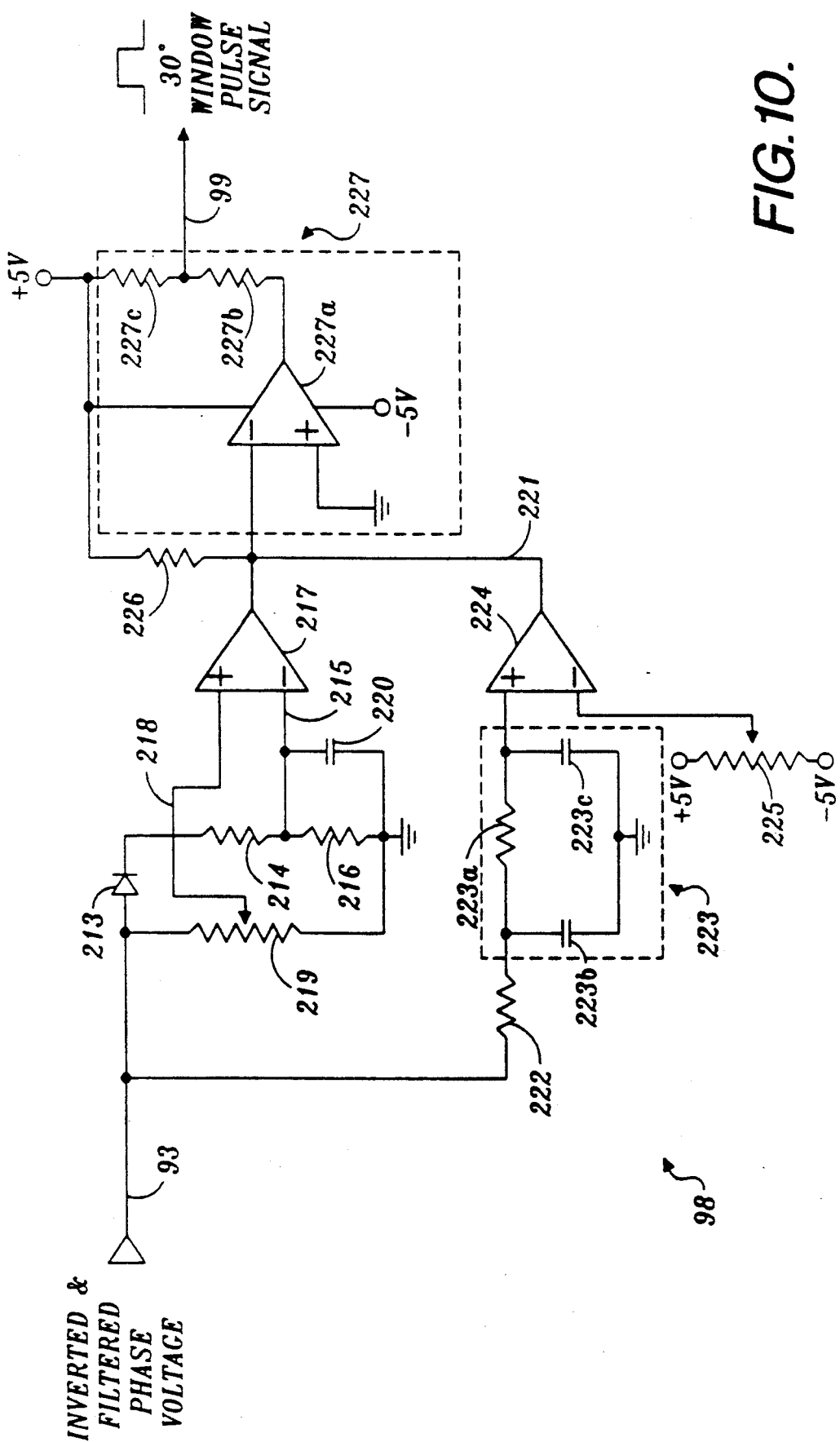
FIG. 10 is an electrical schematic diagram of a window circuit used in controlling connection of the reactive power compensation capacitance.

The components of window circuit 98 for one of the phases are shown in FIG. 10. At the input of the window circuit, lead 93 is connected to the anode of a diode 213, to one side of a potentiometer 219, and to a resistor 222. The signal on lead 93 is half wave rectified by diode 213, and the cathode of the diode is referenced to ground through resistors 214 and 216. These resistors serve to divide the rectified voltage to an intermediate level, which is applied through a lead 215 to the inverting input of a comparator 217. A capacitor 220, which is connected between lead 215 and ground, filters the rectified signal, yielding a positive DC level that is compared to the sinusoidal voltage set by the wiper of potentiometer 219 and applied to the non-inverting input of the comparator through a lead 218.

Resistor 222 is connected to a 90° phase shift circuit 223 that comprises two capacitors 223b and 223c, which are connected at each end of a resistor 223a to ground. The 90° phase shifted sinusoidal waveform output from phase shift circuit 223 is applied to the non-inverting input of a comparator 224; the inverting input is connected to the wiper of a potentiometer 225, which is connected between the +5 V DC and −5 V DC supplies (not shown). The potentiometer wiper provides an adjustable reference voltage, to control a square wave signal on the output of comparator 224. A lead 221 connects the output signals from comparators 217 and 224 together, so that they are summed, producing a logical AND signal that is applied to an output buffer 227. This summed signal is connected to +5 V DC by a resistor 226. Potentiometer 219 is adjusted to vary the width of the square wave signal output from comparator 217; potentiometer 225 is adjusted to vary the start point for the phase-shifted square wave and thus the width of signal produced by combining the output of comparators 224 and 217. Accordingly, a 30° window signal is achieved and supplied to buffer 227. The output buffer comprises a comparator 227a having its output connected to +5 volts through two series-connected resistors 227b and 227c. The voltage division provided by these two resistors serves to convert the 30° window pulse from a signal that varies between −5 volts and +5 volts to a signal that varies from 0 to +5 volts. The 30° window pulse is output on a lead 99, which is connected to the common node of resistors 227b and 227c.

Optical transmitter 100 comprises a plurality of light emitting diodes (not shown) that respond to control signals from local PC controller to produce light signals used for selecting the specific reactive power compensating capacitors that are to be connected to each phase. These light signals are produced by combining the timing signal provided by timing waveform logic circuit 86 over leads 87, for each phase with the control signals from local PC controller 70 over leads 101 and with the 30° window pulse signal from window circuit 98 over leads 99 in an AND gate (not shown). Optical fibers 102 carrying the light signals provide complete electrical isolation from high line voltage that could destroy the components of reactive power compensator 50 that are electrically connected to optical transmitter 100.

In the event that the length of optical fibers 102 required to transmit light signals to switching block 68 causes excessive attenuation of the light signals propagated therethrough, an optical buffer amp (not shown) can be provided to amplify the intensity of the light signals, producing corresponding light signals at its output that are conveyed through the optical fibers 102 to a switch driver 110 in switching block 68, as shown in FIG. 1. Typically, the buffer amp is not required if optical fibers 102 are less than a few hundred feet in length.

Figure 11:
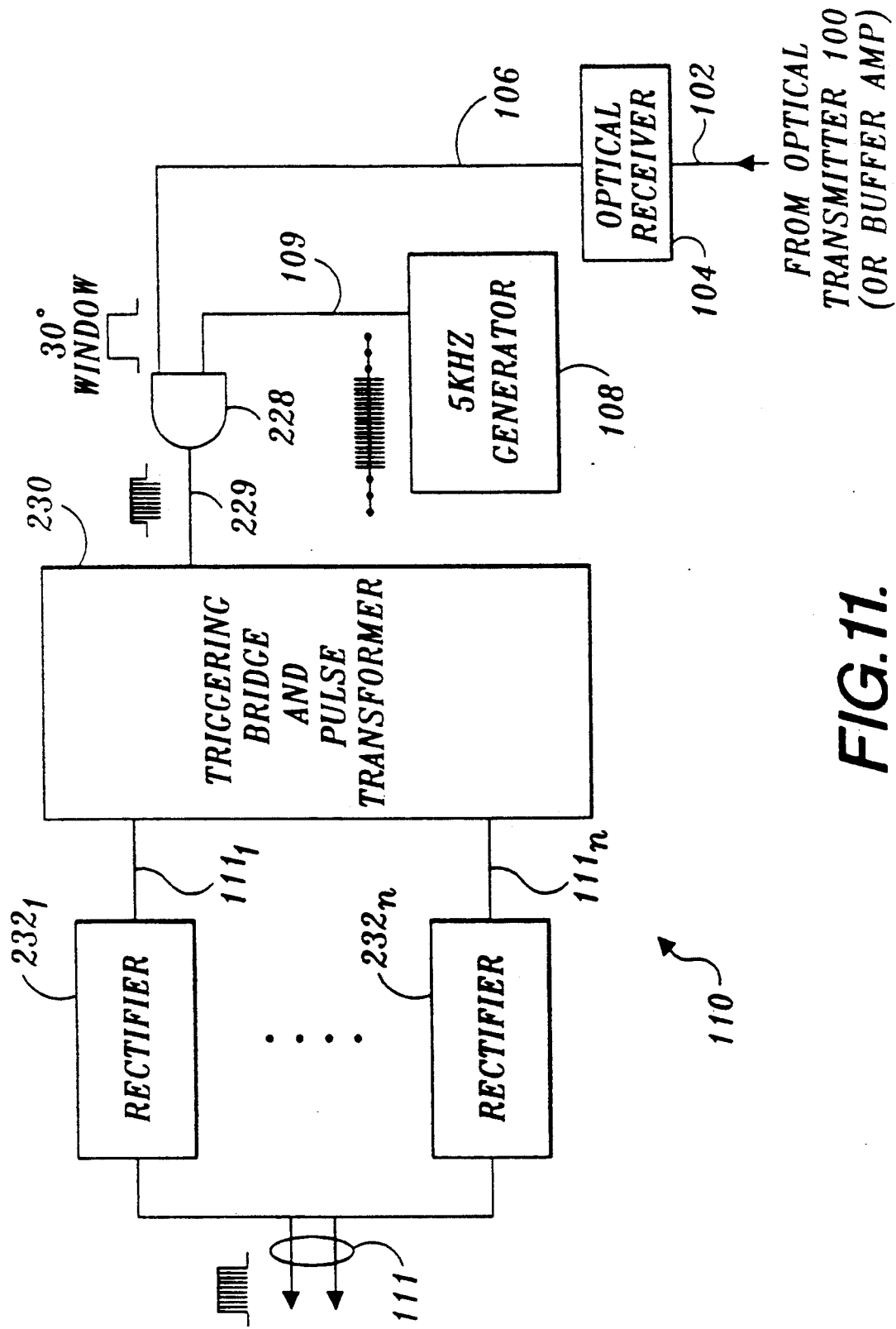
FIG. 11 is a schematic block diagram showing a first embodiment of a switch driver.

FIG. 11 shows only a portion of switch driver 110 used to develop the signals for switching a single compensation capacitor 112. The circuit illustrated in FIG. 11 is typical of other such circuits comprising reactive power compensator 50, each of which is used for one of the compensation capacitors provided for connection to each line 52. Not shown in FIG. 11 are the light sensors included within optical receiver 104 that convert the light signals propagating throughout optical fibers 102 into corresponding electrical pulses. The light pulse conveyed by one of optical fibers 102 is converted to a corresponding electrical pulse by a light sensor in optical receiver 104, and this electrical pulse is input to an AND gate 228, the other input of which is connected to receive 10 KHz pulses produced by 10 kHz generator 108 and conveyed over leads 109. AND gate 228 carries out a logical AND operation to combine these two input signals, producing a 30° window of 10 kHz pulses on its output lead 229, which is connected to a triggering bridge and pulse transformer 230.

Triggering bridge and pulse transformer circuit 230 produces n triggering signals that are conveyed over leads $111_1$ through leads $111_n$ to a corresponding number of rectifier circuits 232, i.e., to rectifier circuits $232_1$ through $232_n$. The number of triggering signals and rectifier circuits needed depends upon the number of SCRs which are required to selectively connect and disconnect each compensation capacitor 112 to provide reactive power compensation for one of lines 52, which in turn depends on the voltage on those lines. Rectifier circuits 232 block the negative portion of the 10 kHz pulses contained in the 30° window output from triggering bridge and pulse transformer 230, producing a 30° window that contains only positive 5 kHz triggering pulses on leads 111.

Figure 12:
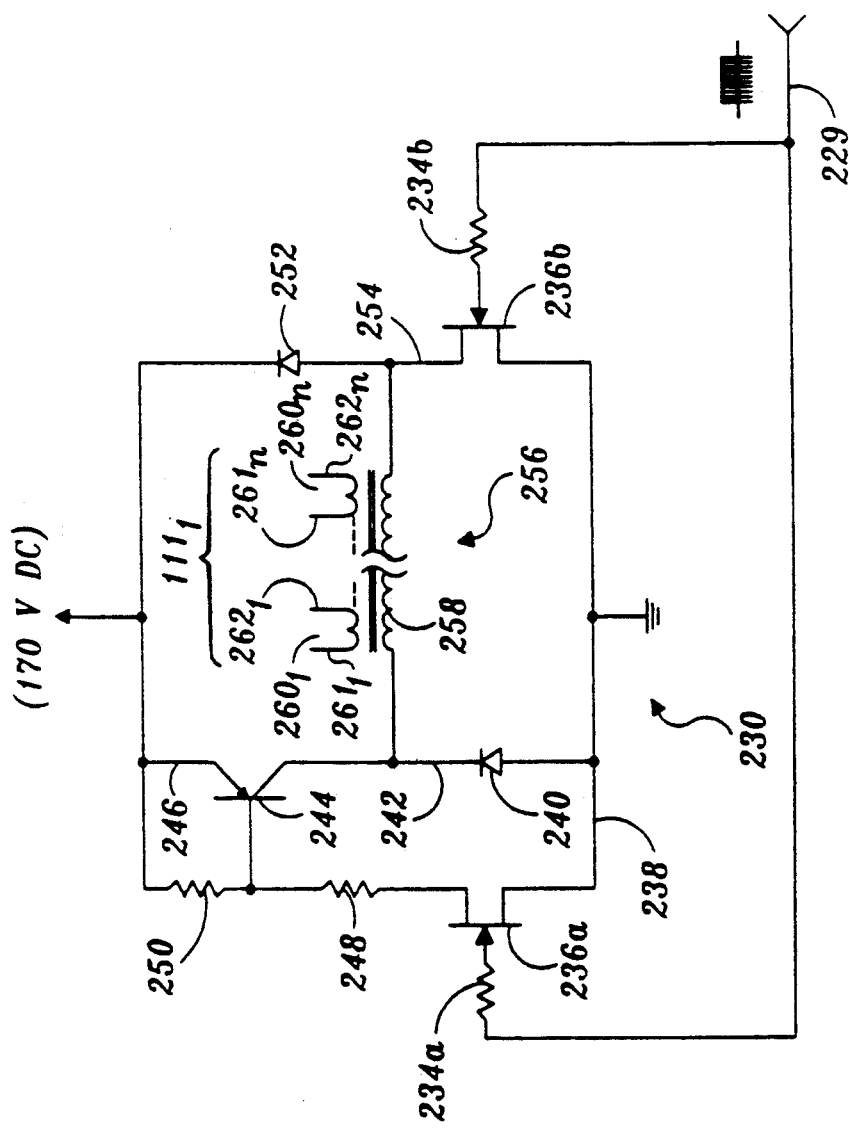
FIG. 12 is an electrical schematic of a triggering bridge and pulse transformer circuit used in the switch driver of FIG. 11.

Details of triggering bridge and pulse transformer 230 are shown in FIG. 12. Output lead 229, which is carrying the 30° window of 10 kHz pulses, is connected on both sides of the triggering and pulse transformer circuit, specifically to resistors 234a and 234b. These resistors are connected to the gate of two field effect transistors (FETs) 236a and 236b. The drains of each of the FETs 236 are connected to ground via lead 238. The anode of a diode 240 is also connected to ground and its cathode is connectesd through a lead 242 to the collector of a PNP transistor 244, which has an emitter connected to 170 V DC via a lead 246. The 170 V DC is also connected to the source of FET 236a through a resistor 248 and a resistor 250. These two resistors are connected in series and their common node is connected to the base of PNP transistor 244. In addition, the 170 V DC is connected to the cathode of a diode 252, the anode of which is connected to the source of FET 236b. A lead 254 connects the source of FET 236b to one end of a primary winding 258 of a pulse transformer 256. The other end of the pulse transformer is connected to lead 242, and thus to the collector of PNP transistor 244 and the cathode of diode 240. A plurality of secondary windings $260_1$ through $260_n$ are connected between leads $261_1/262_1$ through $261_n/262_n$, respectively. Each pair of these leads comprises one of the leads 111 thus carries an envelope of 10 kHz pulses within a 30° window that are used to selectively connect one of the compensation capacitors 112 to provide compensation for one of lines 52. If transient or harmonic distortion in the voltage waveform reverse biases the SCRs, prematurely stopping current flow charging compensation capacitor 112, a successive 10 kHz pulse in the envelope immediately retriggers the SCRs so that charge current again flows.

Operation of triggering bridge and pulse transformer 230 is relatively straightforward. The 10 kHz pulses in the 30° window, which are applied to the gates of FETs 236a and 236b cause the FETs to conduct current. Current flow through resistors 248 and 250 produces a bias signal on the base of PNP transistor 244, causing it to conduct. Current thus flows from the 170 V DC through PNP transistor 244 and through primary winding 258 of pulse transformer 256, continuing on to ground through FET 236b. The resulting 10 kHz pulsating current flow through the primary winding of the pulse transformer causes a corresponding current in its secondary windings $260_1$ through $260_n$. Each time that FETs 236a and 236b turn off, diodes 240 and 252 dissipate residual inductive current flowing within primary winding 258.

Figure 13:
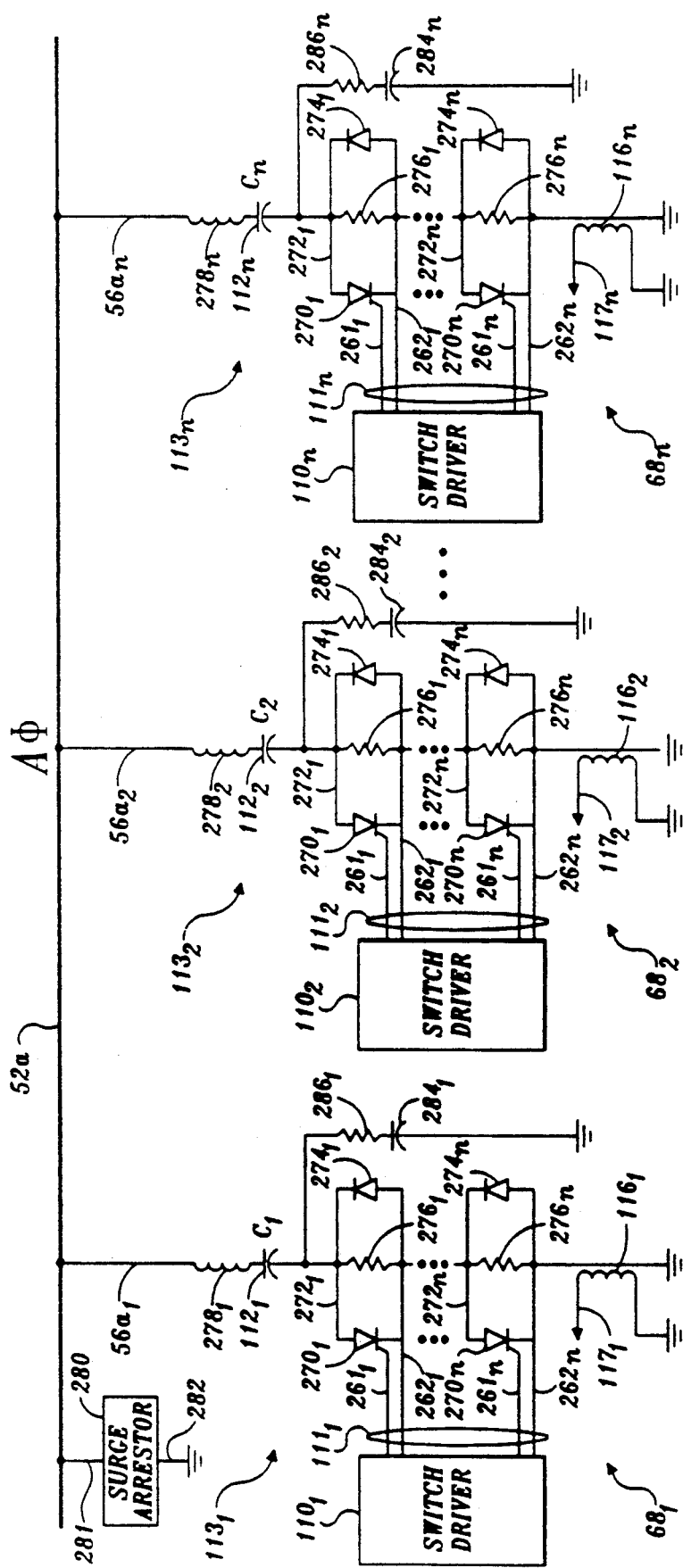
FIG. 13 is a block diagram of a compensation capacitor array for one phase.

FIG. 13 illustrates the configuration in which an array of compensation capacitors $112_1$ through $112_n$ is applied to A phase, line 52a. A specific one of these compensation capacitors 112 is selectively connected to provide reactive power compensation when SCRs $270_1$ through $270_n$ associated with the compensation capacitor are energized to connect that capacitor to ground. Compensation capacitors 112 are electrically connected to lines 52, but do not provide reactive compensation until the SCRs 270 associated therewith in each selectable compensation block 113 are selectively gated into conduction each cycle, providing a current path to the capacitors in respect to ground (on neutral). As shown in this Figure, one switch driver 110 is connected to each of the series connected SCRs 270 associated with one compensation capacitor 112 and selectively provide the gate current required to turn on each SCR so that the compensation capacitor can charge and provide compensation.

It may be helpful to follow one cycle of the voltage waveform on line 52a to understand how SCRs 270 control the compensation provided by compensation capacitor 112. Starting with the voltage on line 52a at its peak positive value, diodes 274 become forward biased as the voltage begins to go negative. Current flows from ground through diodes 274, charging compensation capacitors 112 to the negative peak value of the voltage on line 52a. The charge remains trapped on the capacitor unless it is connected to provide compensation during this cycle. However, if, for example, compensation capacitor $112_1$ is needed to provide compensation during this cycle, triggering signals are applied to the SCRs 270 associated with compensation capacitor $112_1$ as the voltage passes through the negative peak. Diodes 274 then become reverse biased and stop conducting, but the SCRs 270 associated with compensation capacitor $112_1$ are gated into conduction. These SCRs continue to conduct until the voltage on line 52a reaches its positive peak, at which point the current through the SCRs goes to zero and they stop conducting.

Compensation capacitors 112 for each phase can all be of nominally equal capacitance, the compensation provided by one such device being at least the minimum required to compensate for the smallest expected inductive load that will be connected to one of the distribution lines 52. However, it may be preferable to use a different nominal capacitance value for each of the compensation capacitors $112_1$ through $112_n$ in the array for each phase, for example, providing a binary configuration wherein their capacitance values are power of two integer multiples of some minimum value, i.e., the sequence 1, 2, 4, 8, etc. Such choices will be determined by the particular application of reactive power compensator 50 and can readily be accommodated by modifying the program run on local PC controller 70.

A surge arrestor 280 is connected to line 52a through a lead 281 and is connected to ground by a lead 282. Surge arrestor 280 is designed to conduct in the event that the voltage on line 52 substantially exceeds the rated voltage of the line. For example, for a 15 KV line, surge arrestor 280 would typically be designed to limit the voltage on line 52a to a maximum of 30 KV, thereby protecting against surges caused, for example, by lightning strikes.

Switching blocks 68 are generally similar for each compensation capacitor 112, as will be apparent from FIG. 13. A lead $56a_1$ connects compensation capacitor $112_1$ to line $52a$ through an inductor $278_1$. Similarly, a line $56a_2$ connects compensation capacitor $112_2$ to line $52a$ through inductor $278_2$, and likewise, each compensation capacitor $112_n$ in the array is connected to line $52a$ through inductor $278_n$. Associated with each SCR 270 and connected in parallel by a lead 272 are a resistor 276 and a diode 274. In addition, a snubber circuit comprising a resistor 286 in series with a capacitor 284 is connected in parallel with the entire string of SCRs $270_1$ through $270_n$ for each compensation capacitor. Resistor 286 and capacitor 284 protect the series string of SCRs 270 by insuring that the rated voltage rise (dv/dt) and peak voltage are not exceeded. Inductor 278 is selected to limit the current rise di/dt and maximum forward current to the rated values for each of the SCRs 270. Damping provided by resistor 286, capacitor 284, and inductor 278 limits the overshoot and peak voltage across the SCRs.

An example may help to clarify how these components are selected for the snubber circuit. An 8.4 micro-Farad capacitor $112_1$ is used to provide 200 KVAR of compensation in a 15 KV system. Since capacitor $112_1$ can be selectively switched to provide reactive power compensation during each cycle of operation, the string of SCRs 270 must be capable of carrying a total of 24 amps RMS steady state current. Recalling that SCRs 270 are preferably gated to connect capacitor $112_1$ to line $52a$ only at the negative peak of the voltage, the string of SCRs 270 and their associated resistors 276 and diodes 274 must be capable of blocking 24.5 KV, and SCRs 270 and diodes 274 must be capable of carrying at least 24 amps RMS current. Each SCR 270 and diode 274 typically has a voltage rating of 1.6 KV blocking and a DC current rating of 50 amps. A safety factor is provided by including a sufficient number of SCRs (i.e., 22) so that the peak rating for n such SCRs is 35.2 KV peak blocking and 35 amps RMS continuous current.

For this example, inductor $278_1$ is selected to provide one mH of inductance, at a maximum rated voltage of 30 KV. This selection is based upon the following assumptions: (1) the power line is a voltage source with zero source resistance and 4 mH of inductance, (2) the system is underdamped, and (3) the largest excitation is a 28 microsecond pulse of 30 KV (due to the limitation of surge arrestor 280). Accordingly, the peak current rise di/dt (including the source inductance) is 6 amps per microsecond. For this example, resistor $286_1$ should have a resistance of 500 ohms, and capacitor $284_1$ should comprise a pair of 0.02 microFarad 10 KV capacitors connected in series.

It should be noted that diodes 274 can be replaced with SCRs (not shown) having their cathodes connected in reverse bias relative to those of SCRs 270. An appropriate modification to switch driver 110 can provide trigger signals for these additional SCRs to gate them into a conducting state at the positive peak of the potential waveforms on each of lines 52. This modification enables compensation capacitors 112 to be selectively connected to lines 52 at the peak positive and/or peak negative potential on those lines. Thus, for each phase, the required reactive power compensation can be determined as often as twice each cycle, and the appropriate compensation capacitors 112 connected to lines 52 twice each cycle.

If reactive power compensator 50 is used to provide compensation at the current and voltage levels set forth in the above example, pulse transformers 230 must be provided with adequate dielectric insulation to prevent short circuit flashovers. In addition, switch circuits 114 must be properly cooled to prevent the maximum rated junction temperature of SCRs 270 and of diodes 274 from being exceeded. Immersion of pulse transformers 230 and switch circuits 114 in a transformer oil bath (not shown) satisfies both of these requirements. The SCRs and diodes can also be provided with cooling fins (not shown) to improve heat transfer between these solid state devices and the oil. Thermal convective currents in the oil further improves cooling efficiency. The oil also serves as a dielectric medium that insulates the windings of pulse transformers 230, preventing short circuiting and arcing that would otherwise occur if the reactive power compensator is used on relatively high voltage lines, e.g., rated for 15 KV. For use at much lower voltages and compensation currents, it is possible that corrective or forced air cooling would be adequate, and that the pulse transformer insulation would prevent arcing.

OPTICALLY TRIGGERED SWITCH

Triggering bridge and pulse transformer 230, as described above, is used in switch driver 110 to produce triggering pulses that selectively gate the SCRs in switch circuit 114 to connect a specific compensation capacitor 112 to one of the lines 52. An optically triggered switch driver 110' can instead be used for this purpose. One such switch driver $110_1'$, for one compensation capacitor $112_1$ on A phase is shown generally at reference numeral 110' in FIG. 14. Optically triggered switch driver $110_1'$ includes a plurality of optical trigger circuits 288 connected in series, each of which control two solid state switches $350a$ and $350b$. A plurality, n, of these solid state switches connected in a series string can be selectively energized to connect compensation capacitor $112_1$ to ground, thereby providing its compensation to line $52a$. The voltage on line 52 determines the number of solid state switches 350 that must be used. To minimize the differential voltage across solid state switches 350 when they are turned on, they are gated on only when the voltage on the line is at its peak negative value, such that when initially gated on, substantially a zero charge current flows through the solid state switches.

Figure 14:
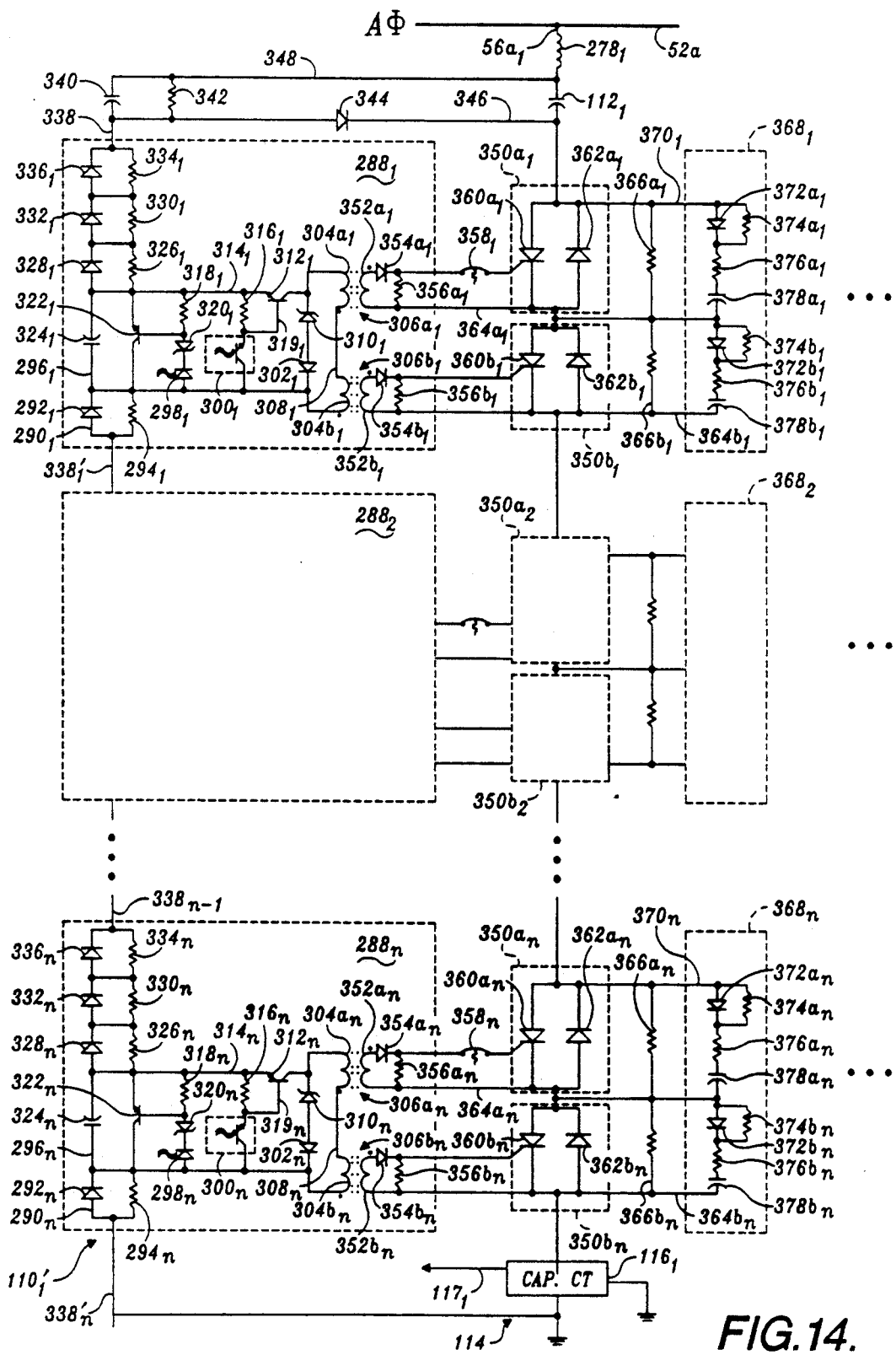
FIG. 14 is an electrical schematic diagram of a network of optically triggered switch drivers and solid state switches for one compensation capacitor on one phase.

In the circuit shown in FIG. 14, the voltage on line $52a$ is nominally 5 KV so that four pair of solid state switches $350a$ and $350b$ are required. Four optical trigger circuits 288 are used to control the solid state switches. As in switch driver 110, each solid state switch $350a$ ($350b$) comprises an SCR $360a$ ($360b$) connected in parallel with a diode $362a$ ($362b$). The four pairs of solid state switches 350 are connected in series between capacitor $112_1$ and ground, and each pair of solid state switches 350 is protected against excessive peak voltage by a separate snubber circuit 368, as explained below.

A key element of optically triggered switch driver 110' is a trigger capacitor 340, which is connected in parallel with compensation capacitor $112_1$. Inductor 278 is connected to both of these capacitors by a lead 348. In addition, a discharge resistor 342 is provided in parallel with trigger capacitor 340, but is partly isolated from compensation capacitor $112_1$ by a diode 344, which has its cathode connected to compensation capacitor 112₁ by a lead 346 and its anode connected to lead 348 via resistor 342. The purpose of trigger capacitor 340 is explained below.

Lead 338' connects each trigger circuit 288 to a lead 290, which is connected to the anode of a diode 292 and a resistor 294. Diode 292 and resistor 294 are arranged in parallel; the cathode of diode 292 is connected by a lead 296 to several components, including an energy reservoir capacitor 324, the collector of an NPN transistor 322, the anode of a light emitting diode 298, the collector of a phototransistor 300, the cathode of a diode 302, and a primary winding 304b of a pulse transformer 306. A lead 308 connects primary winding 304b with one end of another primary winding 304a. The opposite end of primary winding 304a is connected to the cathode of a zener diode 310 and to the collector of an NPN transistor 312. A lead 314 connects the emitter of NPN transistor 312 to a resistor 316, the opposite side of which connects to the emitter of phototransistor 300 and to the base of NPN transistor 312 through a lead 319. In addition, lead 314 connects to a resistor 318, the opposite end of which is connected to the anode of a zener diode 320. The cathode of zener diode 320 is connected to the cathode of LED 298 and its anode is connected to the base of NPN transistor 322. The emitter of NPN transistor 322 connects to lead 314, so that its emitter and collector are in parallel with energy reservoir capacitor 324.

Lead 314 connects to a string of parallel resistors and diodes, which connect to a lead 338' (or a lead 338 at the top of the string). Specifically, a resistor 326 is connected in parallel with a diode 328, a resistor 330 in parallel with a diode 332, and a resistor 334 in parallel with a diode 336. Diodes 328, 332, and 336 are oriented to convey positive charge current to charge trigger capacitor 340; resistors 294, 326, 330, and 334 are relatively high-value resistors to provide a trigger potential equalizing means arranged to balance the voltage distribution across the plurality of series-connected trigger circuits 288 in respect to the voltage across solid state switches 350.

Pulse transformer 306 includes a secondary winding 352a, which is inductively coupled with primary winding 304a and a secondary winding 352b inductively coupled with primary winding 304b. The anode of a diode 354a is connected to one end of secondary winding 352a; similarly, the anode of a diode 354b is connected to secondary winding 352b. A resistor 356a extends between the cathode of diode 354a and a lead 364a that is connected to the other end of secondary winding 352a. A resistor 356b is similarly connected in respect to a lead 364b and secondary winding 352b. A resettable circuit breaker 358 (thermal switch) is provided between the common node at the cathode of diode 354a and resistor 356a, and the gate of SCR 360a. However, since only one such resettable circuit breaker is required for each optical trigger circuit 288, the common node at the cathode of diode 354b and resistor 356b is directly connected to the gate of SCR 360b.

Each snubber circuit 368 includes a diode 372a connected in parallel with a resistor 374a. The cathode of diode 372a and one end of resistor 374 are connected by a lead 370 to the cathode of diode 362a in solid state switch 350a, and thus to solid state switch 350b in the above solid state switch (if any) in the string. If at the top of the string of solid state switches 350, lead 370 connects to reactive compensation capacitor 112₁. The anode of diode 372a and the other end of resistor 374a are connected to a resistor 376a, which is in series with a capacitor 378a. Similarly, a diode 372b, resistor 374b, and a capacitor 378b are provided for protection of SCR 360b and diode 362b. A lead 364b connects capacitor 378b to SCR 360b and diode 362b in switch 350b. Resistors 366a and 366b divide the static blocking voltage equally across the SCR/diode pairs (SCRs 360a/diode 362a and SCR 360b/diode 362b). Capacitors 378a and 378b equalize the dynamic voltage on each SCR/Diode pair, in addition to providing snubber circuit functions. Diodes 372a and 372b limit the discharge current from 378a and 378b to protect SCR 360a and 360b, respectively.

Optically triggered switch driver 110' operates in three states, including a charging state, a holding state, and a discharge state. During the first negative half cycle of potential on the distribution line 52 with which it is associated, it is in the charging state. In this state, current flows from ground through diodes 292, capacitor 324, and through diodes 328, 332, and 336 in each of the optical trigger circuits 288, to charge trigger capacitor 340 and energy reservoir capacitors $324_{1-n}$. After energy reservoir capacitor 324 is charged to a relatively small voltage in each optical trigger circuit, zener diode 320, NPN transistor 322, and resistor 318 clamp the voltage, forcing the excess current to flow through transistor 322. As current flows through them, LEDs 298 emit light, indicating that optically triggered switch driver 110' is in its charging state. After energy storage capacitors $324_{1-n}$ charge to their clamp voltage, trigger capacitor 340 continues to charge to the negative peak voltage of line 52a minus n times the clamp voltage on capacitors 324, as given by the formula:

$$(Vm - n^*Vclamp) = Vc_{340},$$

where Vm = the negative peak voltage on line 52a, Vclamp = the maximum (clamped) voltage allowed on capacitors 324.

Once trigger capacitor 340 has been charged to the negative peak voltage on line 52, the charging process stops as all of the diodes that previously carried charging current become reversed biased. At the same time that the sum of trigger capacitor 340 and energy reservoir capacitors $324_{1-n}$ charges to the negative peak voltage on the line, compensation capacitor 112 also charges to that voltage. This establishes a reverse voltage of n*Vclamp across diode 344. Assuming that compensation capacitor 112 is not required for compensation at this time, optically triggered switch driver 110' enters the holding state. During the holding state, the voltage across the series connected string of solid state switches 350 varies between zero and two times the absolute peak voltage (i.e., Voltage = $V_{max}(1 + \sin(\omega t))$) and the voltage across the series connected string of energy reservoir capacitors 324 also varies in MAGNITUDE between zero and two times the absolute peak voltage, but varies in actual value with an offset of −n*Vclamp, so that the actual voltage value varies from −nVclamp + Vmax(1 + sin(ωt)). It should be apparent that when the voltage on line 52 is at the peak negative value, the voltage at the top of the string of solid state switches is zero, and the voltage at the top of the string of energy reservoir capacitors 324 is −n*Vclamp.

Whenever a specific compensation capacitor 112 is required to compensate an inductive load, light pulses are supplied to each phototransistor 300 in optically triggered switch driver 110' over optical fibers 106. This light pulse signal comprises the 30° window of 5 kHz pulses. Each of the 5 kHz pulses in this light pulse envelope signal turns on phototransistors 300, thereby causing NPN transistors 312 to conduct. When NPN transistors 312 begin to conduct, the charge stored on energy reservoir capacitors 324 is conveyed through primary windings 304a and 304b of each pulse transformer 306. These 5 kHz current pulses through the primary windings of the pulse transformer cause a corresponding 5 kHz current to flow in secondary windings 352a and 352b, which is applied to the gates of SCRs 360a and 360b, respectively. The gate current turns on these SCRs in each of solid state switches 350, discharging trigger capacitor 340 through diode 344 and enabling the selected compensation capacitor 112 to offset the inductive load by providing a path for positive current flow to ground.

Zener diode 310 and diode 302 comprise a "free wheeling circuit" that carries inductive current between each of the 5 kHz pulses in the 30° window. As noted above, the 30° window of 5 kHz pulses insures that harmonic distortion or transients in the voltage on line 52 cannot prematurely turn off solid state switches 350 by causing a brief reversal in the direction of current flow through the SCRs. Diodes 354a and 354b block reverse gate current to SCRs 360a and 360b, respectively.

A current transformer 116 is disposed at the bottom of switch circuit 114 to monitor the current between ground and compensation capacitor 112, thereby providing a feedback signal that is supplied through lead 117 (as shown in FIG. 1). This feedback signal is used to determine whether the compensation capacitor is properly connected to provide compensation when the light pulse signal is supplied to trigger its functional connection to line 52. Current transformer 116 thus detects a fault condition if an expected current flow to compensation capacitor 112 (i.e., reactive power compensation) does not occur.

Figure 15:
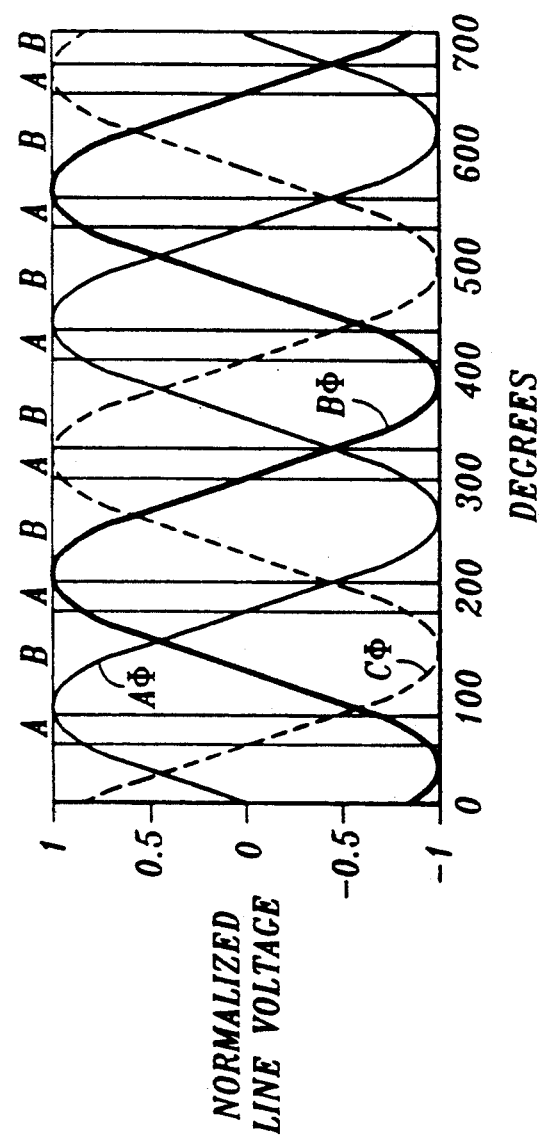
FIG. 15 is a graph illustrating control and data acquisition intervals for several cycles of the three-phase voltage waveforms.

From the preceding discussion, it should be apparent that the time required by local PC controller 70 for determining the appropriate reactive power compensation capacitance for each line 52 and for controlling the connection of the required capacitance to the line is much less than the duration of each cycle of the voltage waveform per phase. FIG. 15 shows several cycles of normalized voltage waveforms for each of the three phases. Once local PC controller 70 determines the specific reactive power compensator capacitors that should be connected to lines 52, during interval A, a substantial time remains for data acquisition. The time required by local PC controller 70 to determine the required reactive power compensation is identified for each phase in this Figure by the intervals "A." The relatively longer remaining time identified as intervals "B" can be used for other tasks, such as data acquisition. During intervals B, local PC controller 70 can digitize the signals produced by the transducers in transducer instrumentation bank 78 and can display the instantaneous or average values indicated by those signals.

Figure 16B:
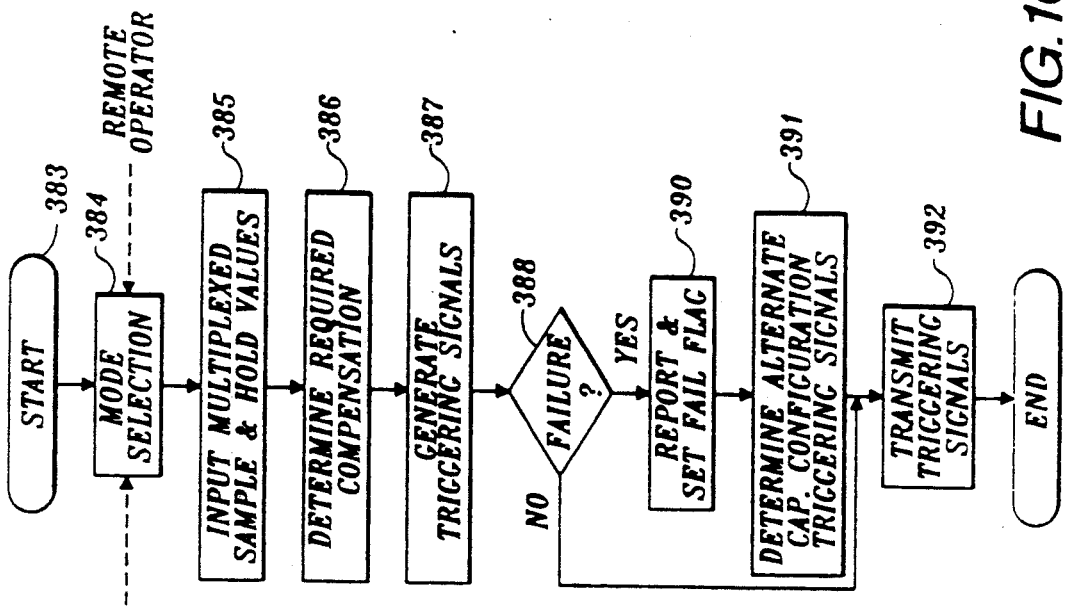
FIG. 16B is a flow chart illustrating the control logic used by a personal computer (PC) in determining and controlling the connection of an appropriate reactive power compensation capacitance to each line of a multiphase system.

Local PC controller 70 does not directly control the times at which the selected compensation capacitors are connected to lines 52. Its principal function is determination of the required compensation and selection of the specific compensation capacitors 112 that will provide the compensation. The remaining time is spent performing data acqusition in a main program shown in FIG. 16A. Timing signals output from timing waveform logic circuit 86 are operative to initiate an interrupt at any time during the data acquisition sequence. In response, local PC controller 70 breaks out of the main program and is required to carry out the control functions shown in FIG. 16B. FIG. 16C illustrates details of the data acquisition function performed within the main program.

Figure 16A:
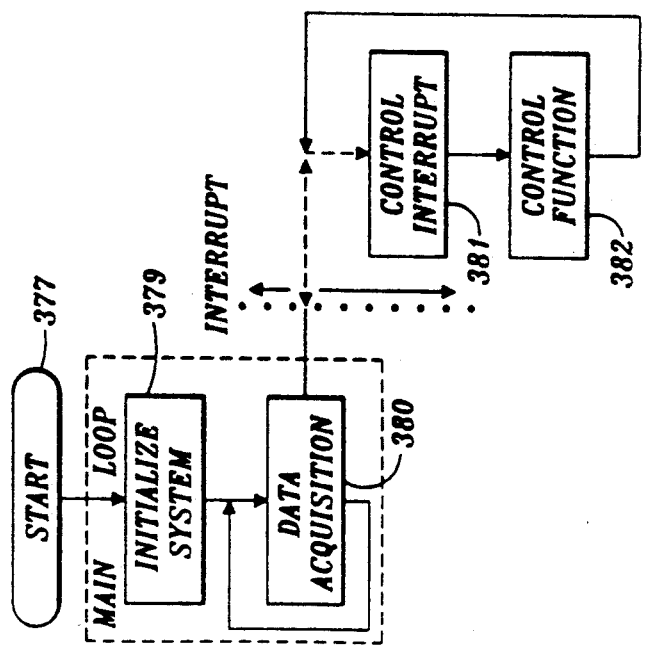
FIG. 16A is a flow chart illustrating a main program loop.
Figure 16C:
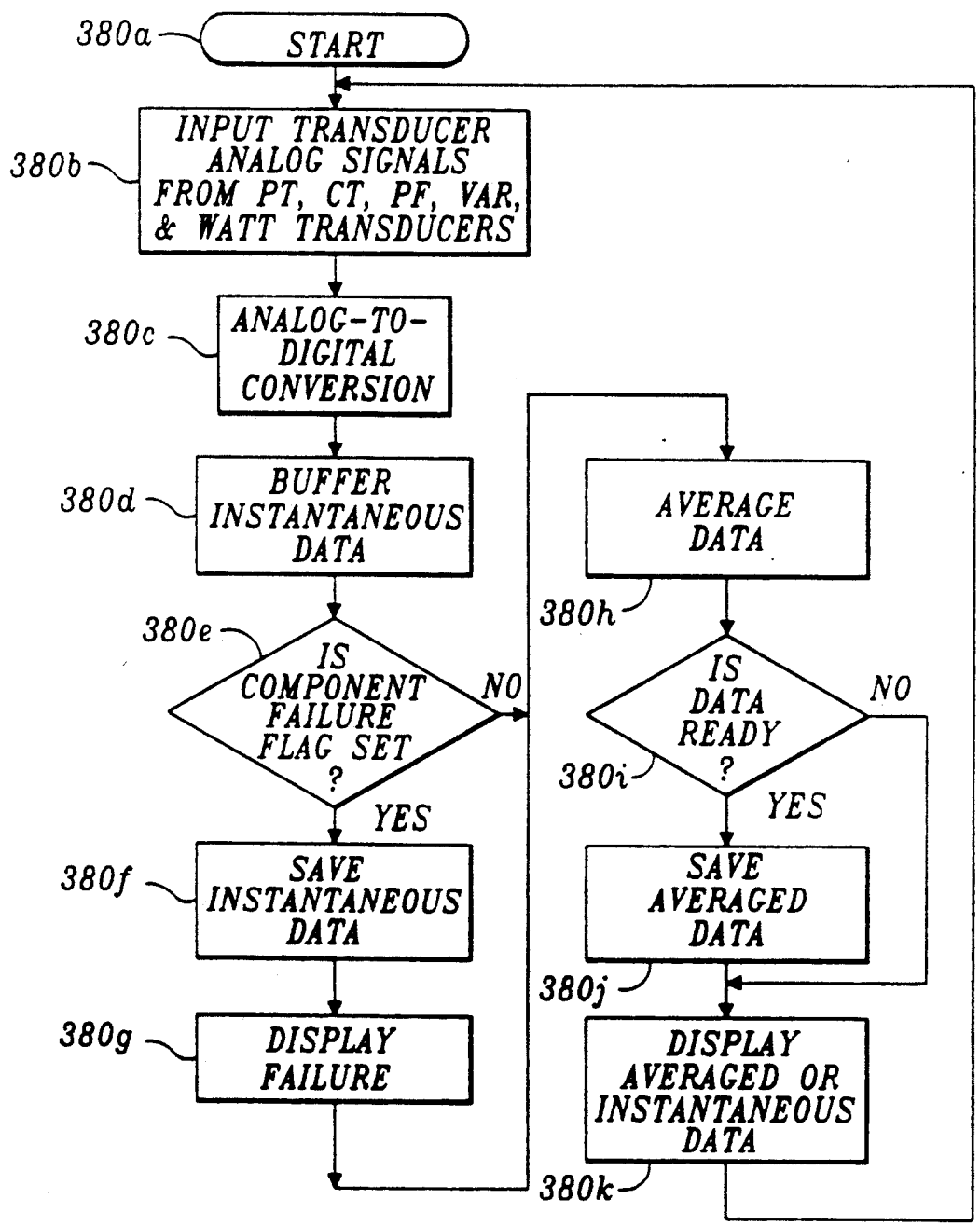
FIG. 16C is a flow chart illustrating the details of the data acquisition logic implemented in the main program of FIG. 16A.

Referring initially to FIG. 16A, the main program starts at block 377 and begins by initializing the system at block 379. During this step, the main program clears all variables and initializes any constants used in data conversion. The main program then enters the data acquisition routine at a block 380, and continuously loops through this routine until an interrupt signal is received from timing waveform logic circuit 86. The interrupt signal causes the local PC controller to perform a control interrupt in a block 381, so that it can carry out the control functions in a block 382, discussed below in respect to FIG. 16B. After the control functions are completed in block 382, local PC controller 70 returns to the point in the data acquisition routine 380 at which it was initially interrupted.

Details of data acquisition routine 380 are shown on FIG. 16C beginning at a start block 380a. Local PC controller 70 receives the transducer analog signals in a block 380b. These signals are input to an A-to-D circuit board (not shown) within the local PC controller and are converted to digital data in a block 380c. The digital data are buffered for subsequent display and averaging by local PC controller 70 in a block 380d.

In the event that a failure flag has been set, indicating that a fault has occurred with one or more of the compensation capacitors 112 (based on the feedback signal provided from current transformers 116), a block 380e causes local PC controller 70 to save the current instantaneous transducer data in a block 380f and to display a failure indication in a block 380g. If the component failure flag has not been set, or subsequent to display of a failure condition, the data corresponding to the signals from each of the transducers are averaged in a block 380h. After accumulating and averaging a predefined number of values for each signal, an average value for each of the data signals produced by the transducers is saved in a block 380j. However, decision block 380i avoids saving the current averaged value for the data prior to the predefined number of values having been obtained. In a block 380k, the averaged (or instantaneous data) are displayed. The program then loops back to block 380b.

The control routine performed by local PC controller 70 starts in FIG. 16B at a block 383. In a block 384, the specific mode in which local PC controller 70 is intended to operate is identified. Either a local operator or a remote operator (using remote PC controller 72 connected via communications link 74) can effect operation of reactive power compensator 50 in one of several different modes, including: (a) a VAR control mode in which a predefined VAR level is maintained on each line 52, (b) a power factor control mode in which a predefined power factor is maintained on each line 52, (c) a line voltage control mode in which the voltage on lines 52 is maintained as a predefined level, and (d) a time control mode in which a predefined reactive power compensation is provided in accordance with a time schedule or table (that is stored in memory) indicating the time of day at which an inductive load connected to the line should be compensated. The operator can also select a manual mode in which specific compensation capacitors 112 are connected to each line.

In a block 385, the multiplexed potential signals and current transformer signals output from sample and hold circuit 96 (see FIG. 1) are input to the analog-to-digital conversion board within local PC controller 70. Digital values corresponding to these signals are provided and can be stored for display during the data acquisition routine. In a block 386, the required compensation is determined. This determination may be made by computing the compensation based on the reactive current measured as the voltage on a phase crosses zero or can be determined using a look-up table. The specific compensation capacitor(s) required for each line 52 are determined in block 386, and in a block 387, a control signal is generated by local process controller 70 that selects the specific compensation capacitor(s) 112 to be connected to each line 52 at the negative peak of the potential on each of those lines. These determinations can be made as often as twice each cycle/phase.

In a block 388, local PC controller 70 checks the feedback signals from current transformers 116 to determine if the selected compensation capacitors are in fact operatively connected to the lines. If a failure or fault is detected, the failed condition is reported by setting a fail flag in a block 390.

In the event of a fault condition, local PC controller 70 can select an alternate configuration of compensation capacitors 112. For example, assume that local PC controller 70 has determined that 400 KVARs of reactive power compensation are required for A phase. However, a fault flag indicates that one of two 200 KVAR compensation capacitors 112 previously selected has not been successfully connected to provide this compensation to line 52a. Assume also that 50 KVAR and 100 KVAR compensation capacitors 112 are available for use on A phase. In this case, local PC controller 70 selects the 50 KVAR and 100 KVAR compensation capacitors 112 in place of the failed compensation capacitor, thereby providing the best available alternative compensation (a total of 350 KVAR). Triggering determination for the alternate capacitor configuration occurs in a block 391 in the event that the fail flag is set in block 390. Thereafter, in a block 392, the triggering signals used to selectively control specific compensation capacitors for each line are transmitted. Alternatively, if in block 389 a failure is not detected, the original compensation capacitor configuration is triggered in block 392. Following the completion of this control routine, the program returns to the data acquisition routine at the same point it was interrupted.

MICROCONTROLLER REACTIVE POWER COMPENSATOR

Figure 17A:
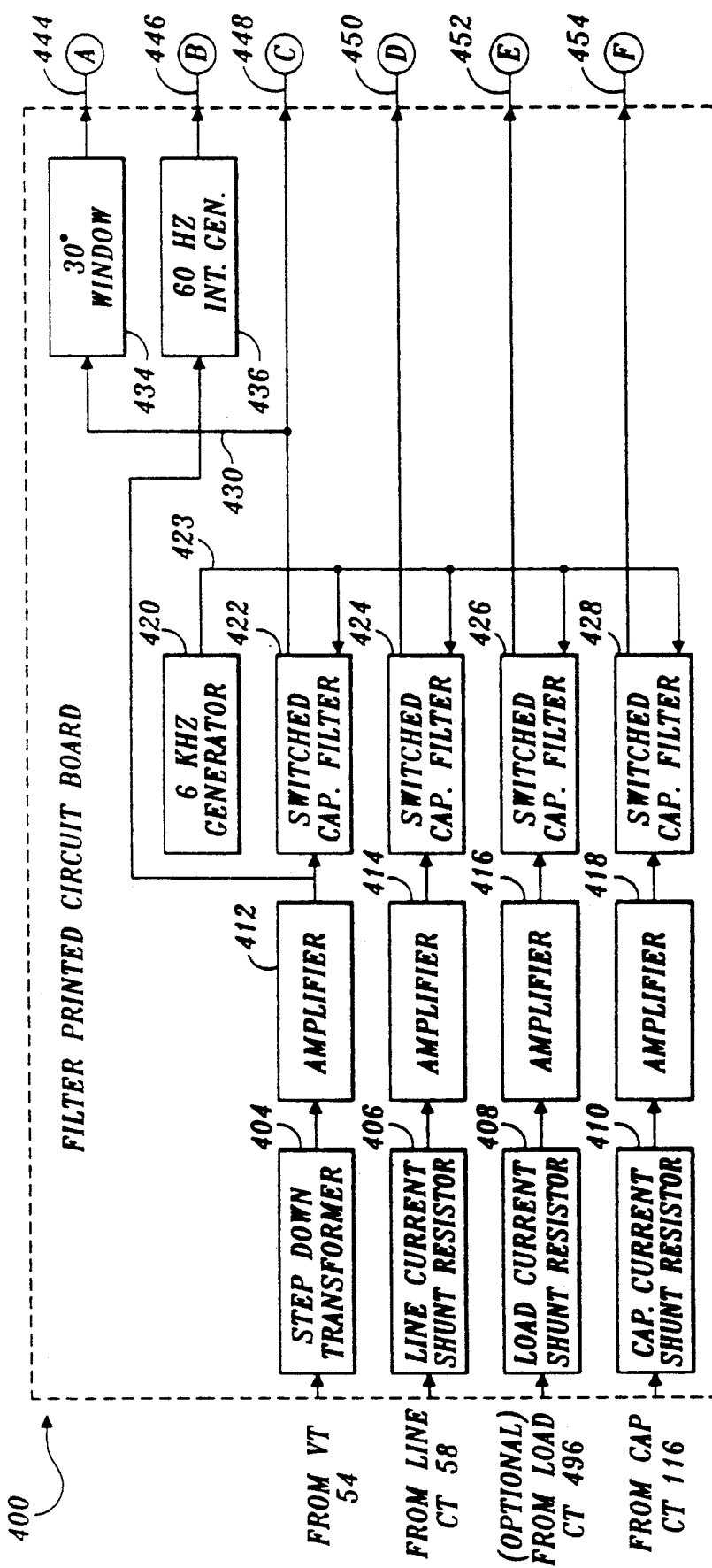
FIGS. 17A, 17B, and 17C are electrical schematic block diagrams of a second embodiment of the reactive power compensator for one phase (AΦ)
Figure 17B:
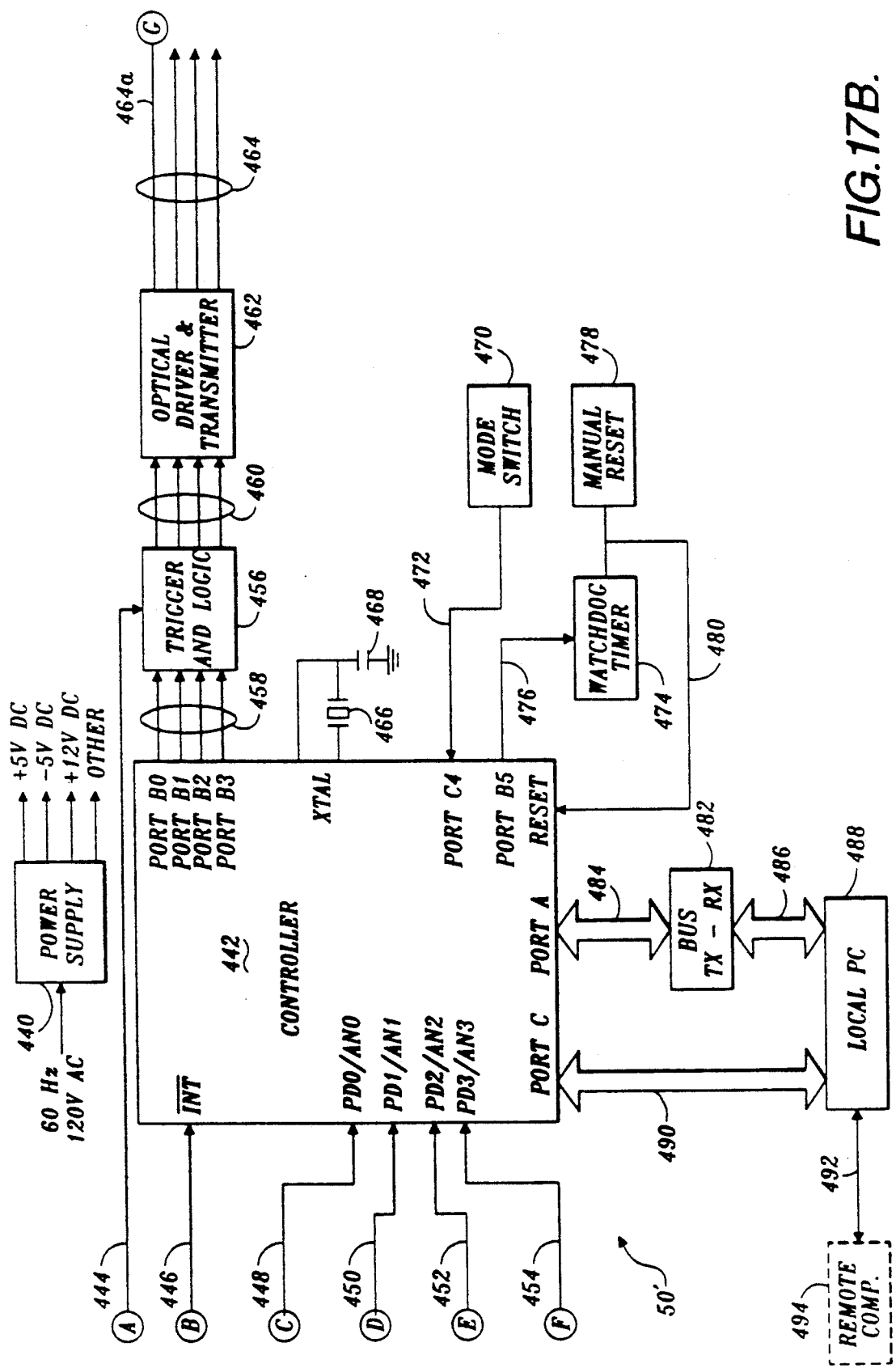
Figure 17C:
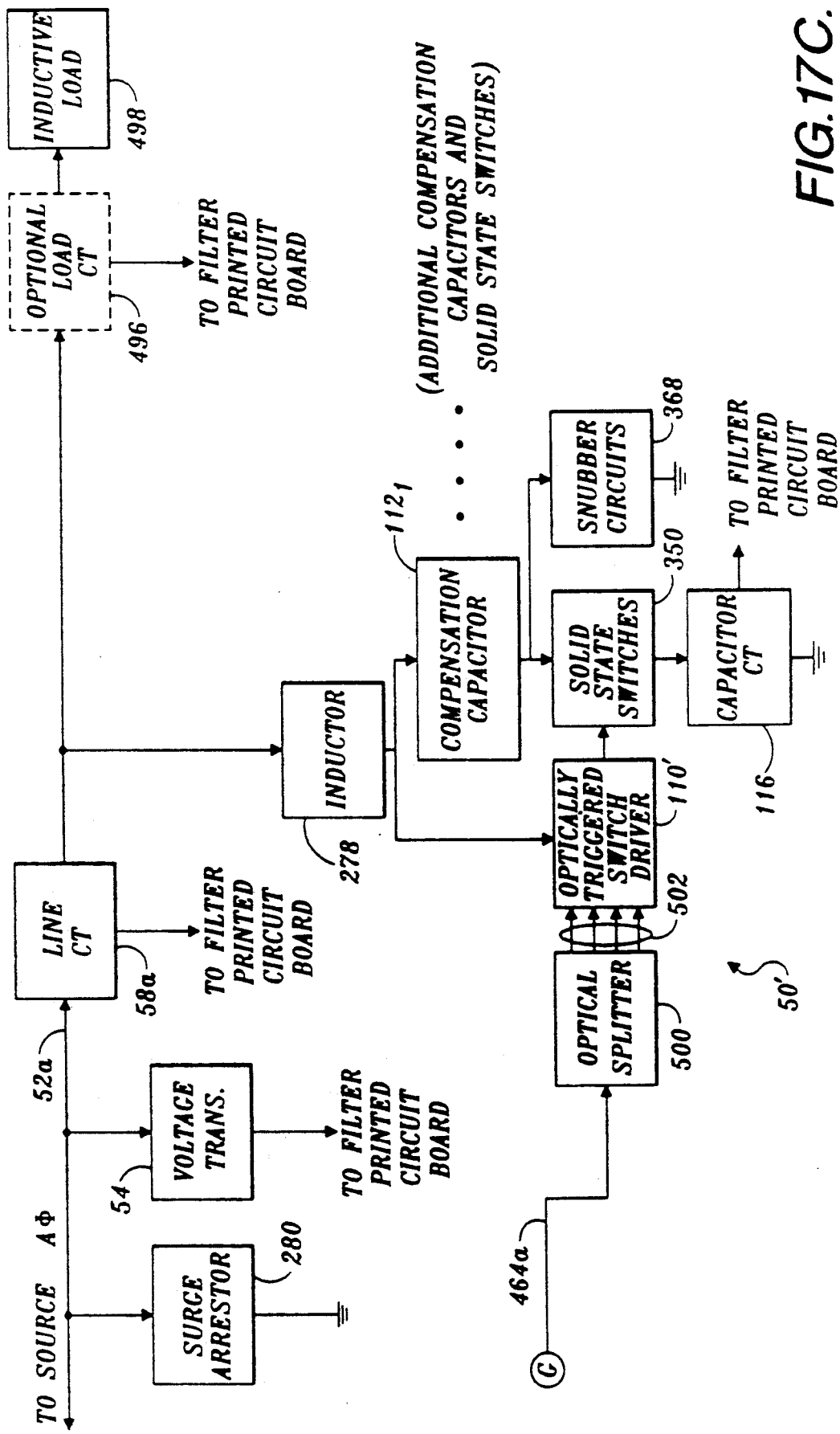

A second embodiment of the reactive power compensator is shown in FIGS. 17A, 17B, and 17C generally at reference numeral 50'. In reactive power compensator 50', the potential signals on each of lines 52a, 52b, and 52c are not used to develop timing signals as in reactive power compensator 50. Instead, the timing signals are developed from an internal timer, which is synchronized to the potential on the line, as will be apparent from the following explanation.

Referring first to FIG. 17A, a filter printed circuit board 400 is shown that includes components for processing current and voltage signals for one phase. A separate filter printed circuit board 400 is required for each line 52a, 52b, and 52c, i.e., for each phase provided reactive power compensation, but only one such board is shown. A signal indicative of the potential on one phase, e.g., line 52a, is applied to a step-down transformer 404, which reduces the level to approximately 12 V AC. Likewise, a signal indicative of current flowing on that phase is applied to a line current shunt resistor 406, producing a corresponding voltage indicative of the line current. Optionally, load current can be similarly monitored, and a signal indicative of the load current can be supplied to a load current shunt resistor 408 to develop a potential corresponding thereto. The feedback signal from current transformer 116, which is connected to monitor the current flowing to the compensation capacitors 112 is applied to a capacitance current shunt resistor 410, likewise producing a potential indicative of that current.

The signal produced by step-down transformer 404 is applied to the input of an amplifier circuit 412, which buffers the signal. Likewise, each of the signals indicative of current developed across the shunt resistors 406, 408, and 410 are applied to amplifiers 414, 416, and 418, respectively, which amplify those signals to a more usable level. The signals produced by amplifiers 412 through 418 are connected to the input of switched capacitance filters 422, 424, 426, and 428. These filters remove most of the harmonic distortion from the signals supplied by the amplifiers so that generally only the fundamental 60 Hz frequency remains, using a 6 kHz reference signal supplied by a 6 kHz generator 420 over a lead 423. The 6 kHz generator may comprise a phase-locked loop or other oscillator (not separately shown). The filtered signals indicative of line voltage, line current, load current, and the filtered feedback signals (from the compensation capacitor CT) are respectively provided on leads 448, 450, 452, and 454. In addition, the signal output from amplifier circuit 412 is applied to a 60 Hz interrupt generator 436, which produces an interrupt signal that is output on a lead 446.

After it is filtered, a signal indicative of potential output from switch capacitance filter 422 is applied to the input of a 30° window circuit 434 through a lead 430 and also supplied as an output on a lead 448. The 30° window circuit produces a square wave on a lead 444 that is approximately 30° wide and begins at about the point at which the potential signal is at its negative peak.

As shown in FIG. 17B, reactive power compensator 50' includes a controller 442. This controller carries out all required timing functions and processing to determine and selectively connect the required compensation capacitor(s) 112 for a single phase. A generally conventional power supply 440 is also included to provide various voltages used by the components of reactive power compensator 50'. Controller 442 receives the interrupt signal from filter printed circuit board 400 via lead 446, which is connected to the interrupt port of the controller. The interrupt signal is generated each time that the potential signal output from amplifier circuit 412 (in FIG. 17A) passes through zero in a positive direction and is used to synchronize controller 442 to the voltage waveform on the phase for which it controls reactive power compensation. That interrupt signal is used in connection with an internal timer having a time base referenced to the frequency of a quartz crystal 466. Quartz crystal 466 and a capacitor 468 are connected to crystal time base inputs of controller 442 and provide a very accurate frequency reference used by it to determine the time at which the reactive power compensation should be computed and connected. For example, based upon the interrupt signal, controller 442 samples the signal indicative of the current on line 52 at a computed time corresponding to the zero crossing of the potential waveform. Controller 442 determines the current based on the signal supplied on lead 450, which is connected to one of its data ports.

Controller 442 comprises a CPU, an 8-bit analog-to-digital converter, timer, multiplexer, and includes both random access memory (RAM) and read only memory (ROM). Several such devices are commercially available from different manufacturers. Using its built-in, analog-to-digital converter, controller 442 digitizes the signals on leads 450, 452, and 454. By comparing the line current with the load current, i.e., by comparing the signals on leads 450 and 452 (assuming that an optional load current CT 496, as shown in FIG. 17C, is being used), controller 442 can detect a self-excitation condition in which the load is producing current. This condition may arise when one or more compensation capacitors 112 are connected to provide compensation if a switch (not shown) is opened on lines 52, allowing an inductive load to start resonantly exciting the line. Optionally, the signal indicative of load current determined by optional load CT 496 can be used for determining the required reactive power compensation instead of the signal indicative of line current.

Since controller 442 also receives a signal indicative of the potential on line 52 via lead 448, it can readily detect an over voltage resonant condition on the line and in response, select a different reactive power compensation (or none) to reduce the voltage. Control of line voltage represents one of several modes noted above in which controller 442 operates. The mode of operation is set by the operator using a mode switch 470, which is connected to controller 442 by a lead 472.

A transmit receive bus 482 connects controller 442 to an optional local PC 488 via leads 484 and 486. Data supplied by controller 442 can thus be transmitted to and displayed on local PC 488. Selection of the mode in which controller 442 operates can also be accomplished by control signals applied to controller 442 over leads 484 and 486 from the local PC. Communication of control signals between local PC 488 and controller 442 is effected over leads 490. Optionally, a remote computer 494, connected by a data link 492 to the local PC, can supply control signals to set the mode of operation or to define the required line voltage, power factor, or VAR level for the connected phase. Remote computer 494 can also interrogate the local PC to determine if a fault condition has occurred in respect to the reactive power compensation.

A watchdog timer circuit 474 is provided to check for an output pulse from controller 442 at least once each 20 milliseconds. In the event that the pulse is not supplied to watchdog timer circuit 474 over a lead 476 within this time frame, a reset signal is automatically supplied to controller 442 over a lead 480. Lead 480 is also attached to a manual reset switch 478. Accordingly, an operator can initiate a manual reset of controller 442 by closing manual reset switch 478.

Figure 19:
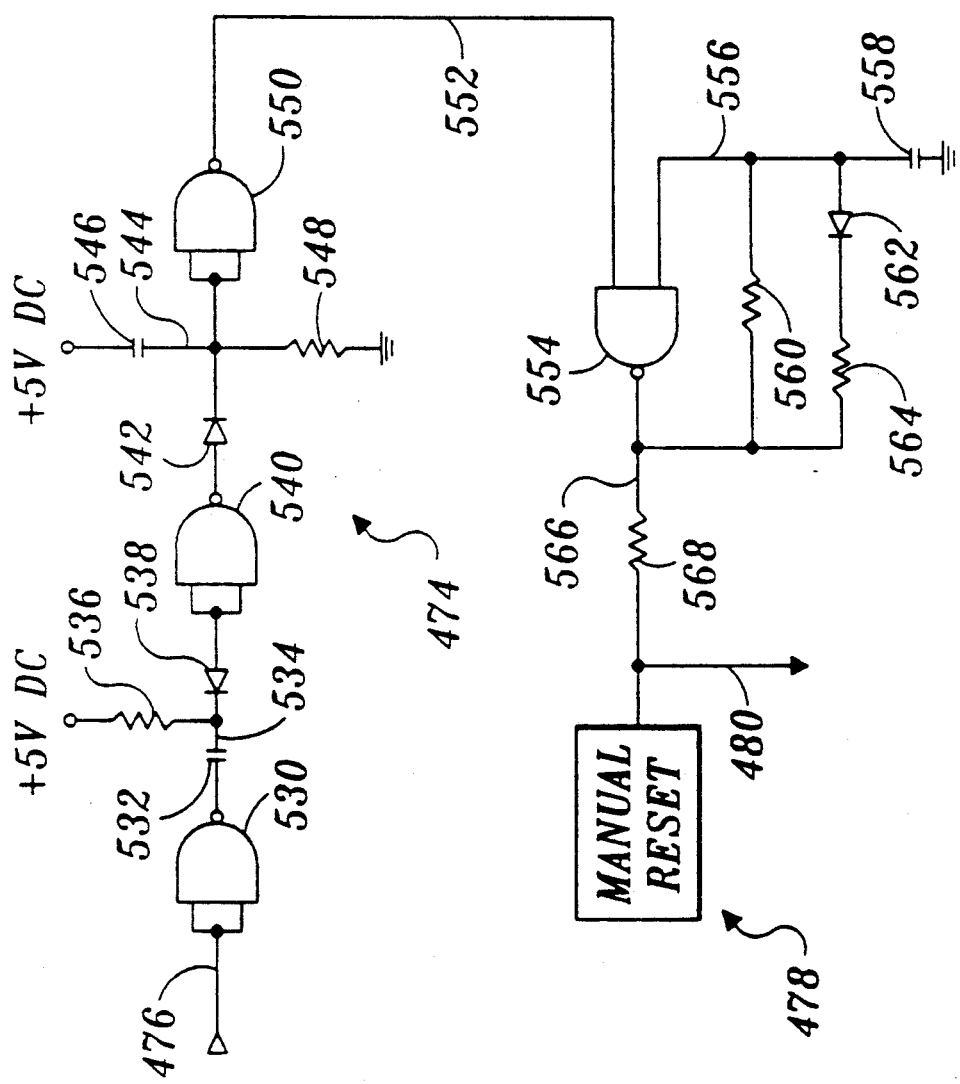
FIG. 19 is an electrical schematic diagram of the watchdog timer circuit noted in FIG. 17B.

FIG. 19 illustrates the watchdog timer circuit, which includes a NAND gate 530, that is connected to lead 476. The pulse supplied by controller 442 over lead 476 is applied to both inputs of NAND gate 530, setting its output to a logic level 0. A capacitor 532 is connected to the output of NAND gate 530. When the output is at a logic level 0, the opposite side of capacitor 532 charges with current supplied from the 5 V DC supply through a resistor 536 and a lead 534. The charge on capacitor 532 reverse biases a diode 538, causing the inputs of a NAND gate 540, which are connected to the anode of diode 538, to go to a logic level 0. As a result, the output of NAND gate 540 is set to a logic level 1, which is transmitted through a diode 542, cancelling the charge that has built up on a capacitor 546. Capacitor 546 is connected to the cathode of diode 542 by a lead 544; the other side of capacitor 546 connects to the +5 V DC supply. A resistor 548 is also connected to the cathode of diode 542 and controls the rate at which capacitor 546 charges, thereby controlling the logic level applied to both inputs of a NAND gate 550. A logic level 1 that is produced when a pulse propagates through diode 542 to the inputs of NAND gate 550 causes a logic level 0 to appear on its output.

The output of NAND gate 550 is connected by a lead 552 to the input of a NAND gate 554. Assuming that a pulse was not provided by controller 442, the output of NAND gate 550 is a logic level 1, producing a logic level 1 on the output of NAND gate 554. A resistor 560 conducts the output of NAND gate 554 to its other input via a lead 556. A series-connected resistor 564 and a diode 562 are connected in parallel with resistor 560, the anode of diode 562 being connected to lead 556. A capacitor 558 is connected between ground and lead 556. A logic level 1 output on NAND gate 554 thus charges capacitor 558 through resistor 560, until a logic level 1 appears on both inputs of NAND gate 554, changing its output to a logic level 0. The logic level 0 on the output of NAND gate 554 is conveyed by a lead 566 through a resistor 568 to manual reset switch 478 and is connected to the reset port on controller 442 through lead 480. After resetting controller 442, the voltage on capacitor 558 discharges through diode 562 and resistor 564, changing the level on lead 566 back to a logic level 1.

Referring back to FIG. 17B, a plurality of leads 458 are connected to output ports B0 through B3 on controller 442 and convey control signals to a trigger and logic circuit 456. In addition, the 30° window signal from the filter printed circuit board is applied to trigger and logic circuit 456 via lead 444. In response to these control signals and the 30° window signal, trigger and logic circuit 456 produces control signals which are conveyed over leads 460 and applied to an optical driver and transmitter 462.

Optical driver and transmitter 462 produces light signals that are conveyed over optical fibers 464 to selectively switch the compensation capacitors selected as appropriate for providing the required compensation to one of lines 52. Each optical fiber 464 conveys the light signal used to trigger solid state switches 350 to connect the selected compensation capacitor to the line.

Figure 18:
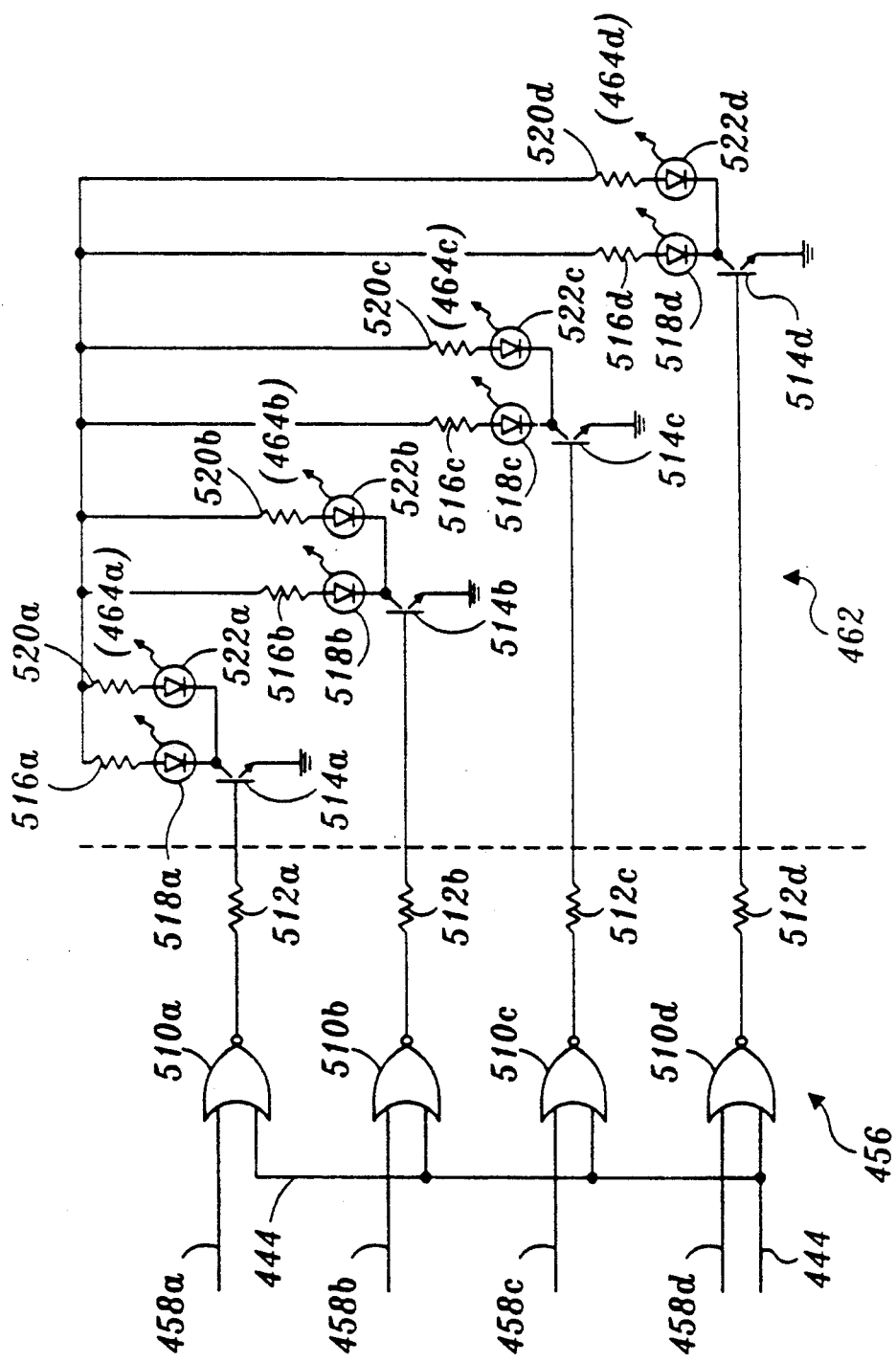
FIG. 18 is an electrical schematic diagram of the trigger and logic circuit and optical driver and transmitter of the second embodiment shown in FIGS. 17A, 17B, and 17C.

Details of trigger and logic circuit 456 and optical driver and transmitter circuit 462 are shown in FIG. 18. Leads 458a, 458b, 458c, and 458d convey control signals that are applied to one input of NOR gates 510a, 510b, 510c, and 510d, respectively, in trigger and logic circuit 456. The other input to these NOR gates is provided by lead 444, which carries the 30° window pulse signal. However, the control signals supplied over leads 460 and the 30° window pulse signal supplied on lead 444 are inverted. As a result, NOR gates 510 have a logic level 1 output only if both inputs are at logic level 0, i.e., when the control signal selects a compensation capacitor during the 30° window. The 30° window signal is redundant, insuring that a compensation capacitor is not triggered to connect to line 52 other than during the 30° following the negative peak voltage of the potential waveform on that line.

The output signals from NOR gates 510 are supplied to the base of NPN transistors 514a, 514b, 514c, and 514d through series resistors 512a, 512b, 512c, and 512d, respectively. The emitters of NPN transistors 514 are each connected to ground, and their collectors are each connected to resistors 516 and light emitting diodes 518, which are in series. In addition, the emitters of NPN transistors 514 are also connected to resistors 520 and light emitting diodes 522, which are also in series, but are in parallel with each pair of resistors 516 and diodes 518. Light emitting diodes 518 provide a visual indication that a specific compensation capacitor 112 has been selected, while light emitting diodes 522 transmit the light signal through optical fibers 464a, etc. required to trigger conduction through solid state switches 350.

FIG. 17C illustrates how optical fiber 464a is connected to an optical splitter 500 that divides the light signal propagating through optical fiber 464a into a plurality of light signals that are supplied through optical fibers 502 to optically triggered switch driver 110'. Alternatively, switch driver 110 can be used in reactive power compensator 50'. The light signals supplied through optical fibers 502 simultaneously trigger each of the SCRs in the solid state switches to conduct, connecting the selected compensation capacitor 112 so that its compensation is provided to line 52a, as shown in FIG. 17C. Similarly, each of the other compensation capacitors available are selectively controlled by optical signals propagating over other optical fibers 464 to other optical splitters (not shown), to compensate an inductive load 498, which is connected to line 52a. In addition, each of the two other phases, lines 52b and 52c, are similarly separately provided an appropriate reactive power compensation by selectively controlling the compensation capacitance connected to those lines.

Reactive power compensator 50' has several advantages over reactive power compensator 50. Since each phase is controlled in respect to timing signals derived from the voltage waveform on that phase, it is not necessary that all three phases be operational to develop timing signals, as is the case in reactive power compensator 50. Furthermore, since the timing is controlled in respect to an internal timer in controller 442, a substantial simplification and reduction in the number of components required is effected. Controller 442 also benefits from the inclusion of watchdog timer circuit 474 to insure that it is operating properly. Since all of the timing events are developed in software in respect to the internal timer, controller 442 can easily be modified by changing the program logic used to control it. Local PC 488 is not required for determining reactive power compensation; however, it can be used for data acquisition, if desired.

Figure 20A:
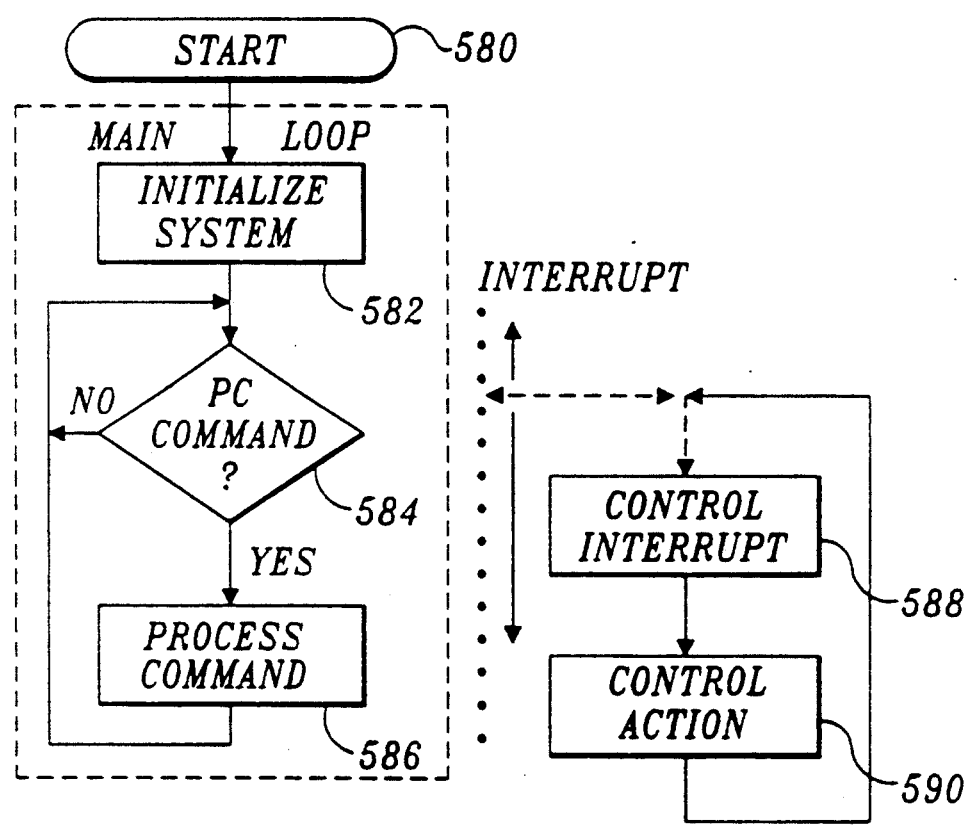
FIG. 20A is a flow chart of the main program implemented by the controller of the second embodiment shown in FIG. 17B.
Figure 20B:
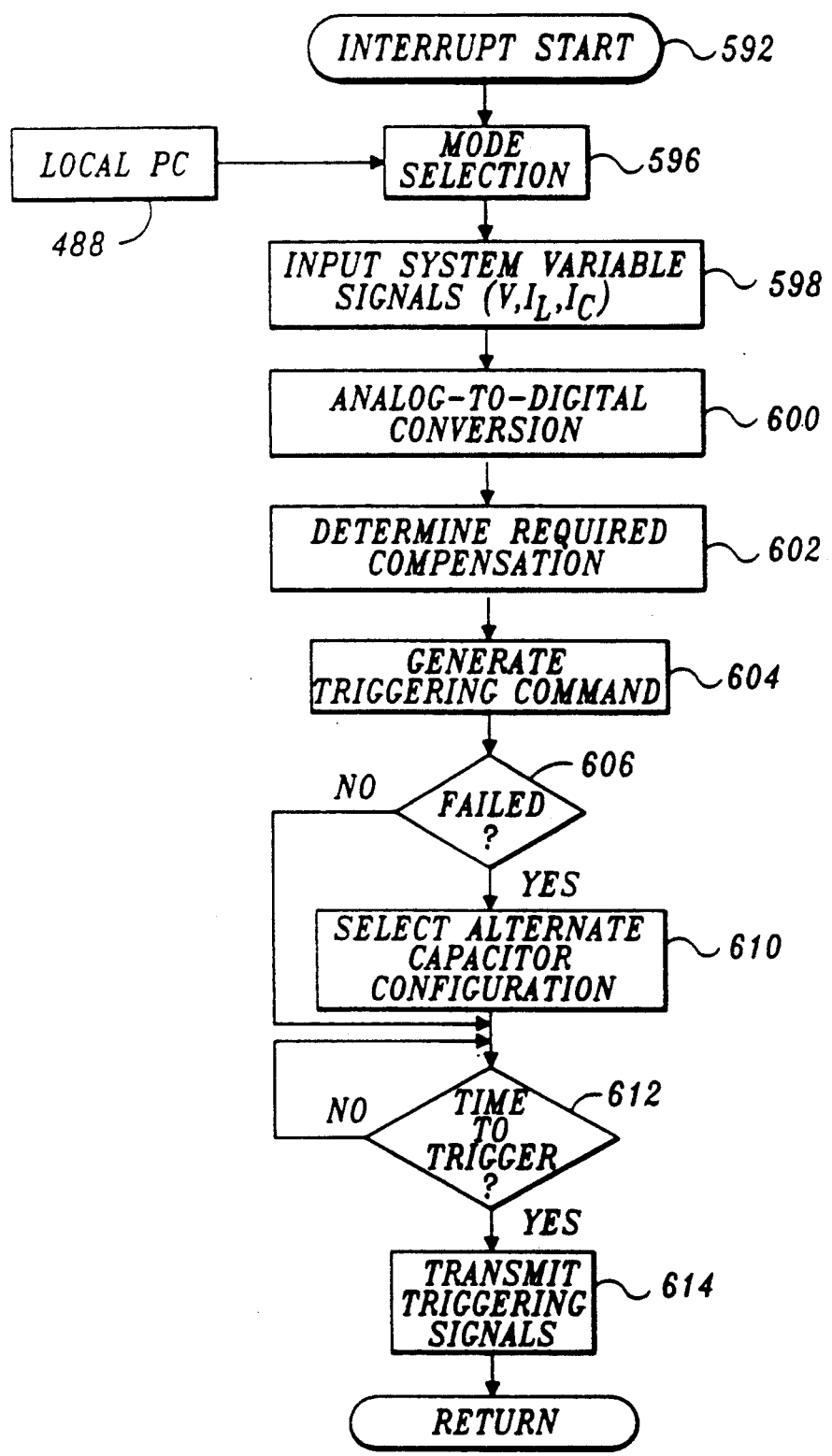
FIG. 20B is a flow chart of the logic implemented by the controller in determining and controlling the connection of the appropriate reactive power compensation capacitance for one phase.

The program logic implemented by controller 442 is disclosed in FIGS. 20A and 20B. The main program logic implemented by controller 442 starts at a block 580. In a block 582, controller 442 initializes the system, resetting all the variables to zero. Subsequently, in a decision block 584, the program determines if local PC 488 has provided a command, such as a change in operating mode. If so, decision block 584 branches to a block 586, which processes that command. Thereafter, or if a command from local PC 488 has not been received, the main program loops back to check again for a PC command. When the manual mode is selected, the operator can use the local PC to select specific compensation capacitors 112 that controller 442 connects to the line. In this mode, the controller does not select or determine the required compensation like it does in the automatic mode. At any time during the processing of a command from the local PC, an interrupt can be initiated in response to the interrupt signal input on lead 446. If an interrupt occurs, the appropriate control action is taken in a block 590; thereafter, the controller returns to the main loop at the point it was interrupted.

In FIG. 20B, the control logic implemented each time that an interrupt signal occurs on lead 446 is illustrated. Following a start block 592, the operating mode of the reactive power compensator is checked in a mode selection block 596. A command input from local PC 488 can effect modification of the mode selection manually determined by mode switch 470 (in FIG. 17B). Thus, for example, the operator can use local PC 488 to select a VAR, PF, line voltage, or time schedule control mode. In a block 598, the system variables comprising voltage, line current, and the feedback signal indicative of the charge current flowing into the reactive compensation capacitor are input to controller 442. In a block 600, controller 442 carries out an analog-to-digital conversion, developing corresponding digital signals, which are used in a block 602 to determine the required compensation, preferably using a look-up table in memory. In a block 604, controller 442 generates the triggering command that is output through leads 458, as shown in FIG. 17B.

Based upon the amplitude of the feedback signal indicative of charge current supplied to the compensation capacitor (if previously connected to provide compensation) over lead 454, controller 442 determines whether a failure or fault has occurred in a decision block 606. If the feedback signal fails to match an expected reactive power compensation current, a failure is detected. If a selected compensation capacitor 112, or its associated solid state switches 350 (shown in FIG. 17C) have failed, controller 442 branches to a block 610, which provides the triggering signals for a best available alternative compensation capacitor configuration. If a failure has not occurred, or following selection of the alternate configuration, the controller determines whether it is time to provide the trigger signals on leads 458 in a decision block 612. As explained above, these trigger signals are logically combined with the 30° window signal on lead 444 in trigger and logic circuit 456 to control production of the light signals that selectively activate connection of each compensation capacitor 112 to the line). If not, controller 442 continues to loop until it determines that sufficient time has elapsed since the interrupt signal occurred for the potential on the associated phase to reach the negative peak level. At that point, in a block 614, the controller transmits triggering signals over leads 458, which cause the appropriate reactive power compensation capacitance to be connected to one of the lines 52.

While the present invention has been disclosed in respect to several preferred embodiments, those of ordinary skill in the art will appreciate that further modifications can be made thereto consistent with the claims that follow below. Accordingly, the scope of the invention should not in any way be limited by the description of the preferred embodiments, but instead, should be determined entirely by reference to the claims.

The embodiments of the invention in which an exclusive property or privilege is claimed are defined as follows:

1. An optically triggered solid state switch, comprising:
   (a) energy storage means, connectable to a voltage source that varies periodically by cycling between positive and negative potentials, for conveying an electrical current and for storing an electrical charge resulting from the electrical current while the voltage source is at one of the positive and negative potentials;
   (b) transformer means, connected generally in parallel with the energy storage means, for producing a trigger pulse in response to a pulse of electrical current flowing through the transformer means from the electrical charge stored by the energy means;
   (c) light sensitive switch means, connected generally between the energy storage means and the transformer means, for controllably discharging the electrical charge stored by the energy storage means in response to a pulse of light, thereby producing the pulse of electrical current flowing through the transformer means; and
   (d) triggered switch means, connected to the transformer means, for providing a conductive path for an electrical current to flow in respect to the voltage source as the voltage source cycles through substantially a zero potential across the triggered switch means, in response to the trigger pulse.

2. The optically triggered solid state switch of claim 1, further comprising a trigger capacitor connected to the energy storage means and connectable to the voltage source, the trigger capacitor charging to a peak potential of the voltage source as the electrical current flows through the energy storage means.

3. The optically triggered solid state switch of claim 1, wherein the energy storage means comprise an energy storage capacitor that stores the electrical charge, charging path means for conveying the electrical current that provides the electrical charge stored on the energy storage capacitor, and at least one diode connected in series with the energy storage capacitor, the diode being thus connected to carry the electrical current in one direction.

4. The optically triggered solid state switch of claim 1, wherein the transformer means comprise a primary winding and a secondary winding, the primary winding being connected to the energy storage means and the secondary winding being connected to the triggered switch means.

5. The optically triggered solid state switch of claim 1, wherein the triggered switch means comprise a silicon controlled rectifier and a diode connected in parallel with each other, the silicon controlled rectifier having a gate that is connected to the transformer means to receive the trigger pulse and in response, causing the silicon controlled rectifier to begin conducting the electrical current, the diode being connected to carry an electrical in an opposite direction from that in which the silicon controlled conducts the electrical current.

6. The optically triggered solid state switch of claim 1, wherein the light sensitive switch means comprise a phototransistor having a collector and an emitter connected to the energy storage means, and a transistor controlled by the phototransistor so that the transistor conducts the electrical current through the transformer means when the phototransistor causes the transistor to conduct.

7. The optically triggered solid state switch of claim 1, wherein a plurality of optically triggered solid state switches are connectable in series to the voltage source to provide the conductive path if the voltage source exceeds a peak voltage rating of a single optically triggered solid state switch, said plurality of optically triggered solid state switches thereby being capable of interrupting current flow from the voltage source when the triggered switch means stop conducting.

8. The optically triggered solid state switch of claim 7, further comprising snubber means for protecting the triggered switch means from transient voltages in excess of the peak voltage rating.

9. The optically triggered solid state switch of claim 1, wherein the triggered switch means are connected to provide the conductive path between a ground connection and a capacitor that is connected to the voltage source.

10. The optically triggered solid state switch of claim 1, further comprising means for providing the light pulse to the light sensitive switch means.

11. A solid state switch circuit for selectively controlling an electrical current in respect to a periodically varying high voltage, comprising:
    (a) a plurality of solid state switches connected in a series relationship, the plurality of solid state switches each including a gate that is responsive to a trigger signal, causing the solid state switches to conduct the electrical current;
    (b) charge storage means for storing an electrical charge used in developing the trigger signal;
    (c) triggering means, connected to the charge storage means, for generating the trigger signal for each solid state switch using the electrical charge stored by the charge storage means, in response to a control signal; and
    (d) trigger potential equalizing means, connectable to the periodically varying high voltage, and connected to the plurality of solid state switches and charge storage means, for minimizing a differential voltage across the plurality of solid state switches during part of a cycle of the periodically varying high voltage, the control signal being applied to cause the triggering means to produce the trigger signals only as the periodically varying high voltage cycles through substantially a zero potential across the plurality of solid state switches, so that transient noise is not produced when the plurality of solid state switches begin to conduct electrical current.

12. The solid state switch circuit of claim 11, wherein the charge storage means comprise a plurality of energy storage capacitors connected generally in a series relationship with the trigger potential equalizing means, and means for charging the energy storage capacitors with an electrical current that flows to the trigger potential equalizing means.

13. The solid state switch circuit of claim 12, wherein the means for charging comprise a plurality of transistors and diodes, the transistors being connected to conduct current to charge the energy storage capacitors and the diodes being connected in the series relationship with the energy storage capacitors so as to charge successive energy storage capacitors to different potential levels.

14. The solid state switch circuit of claim 11, wherein the solid state switches each include a diode that mounted to carry current in an opposite direction from that in which the solid state switches conduct in response to the trigger signals.

15. The solid state switch circuit of claim 11, wherein the solid state switches conduct the electrical current bidirectionally in response to trigger signals supplied at opposite peak levels of the periodically varying high voltage.

16. The solid state switch circuit of claim 15, wherein each solid state switch comprises two parallel connected silicon controlled rectifiers, connected so as to conduct the electrical current in opposite directions in response to the trigger signals.

17. The solid state switch circuit of claim 11, wherein the triggering means comprise a plurality of light sensitive switches, the light sensitive switches conveying the electrical charge from the charge storage means to produce the trigger signals response to a light control signal.

18. The solid state switch circuit of claim 17, wherein the triggering means further comprise a plurality of pulse transformers, each having a primary winding and a secondary winding, the electrical charge conveyed by the light sensitive switches being applied to the primary windings to produce the trigger signals on the secondary windings.

19. The solid state switch circuit of claim 11, wherein the trigger potential equalizing means comprise a capacitor that is charged to a peak of the periodically varying high voltage as the charge storage means accumulate the electric charge.

20. The solid state switch circuit of claim 11, further comprising snubbing means, connected in parallel with the plurality of solid state switches, for protecting the solid state switches against an overvoltage condition.

21. A method for selectively switching an electrical current at a periodically varying high voltage, comprising the steps of:

(a) charging a trigger capacitor to a peak voltage level of the periodically varying high voltage;
(b) developing a stored electrical charge;
(c) producing a plurality of trigger signals using the stored electrical charge, when the periodically varying high voltage is at the peak voltage level; and
(d) applying the plurality of trigger signals to a network of solid state switches connected in a series relationship with the trigger capacitor, the trigger signals causing the solid state switches to begin conducting the electrical current only when a voltage across the network is substantially zero, thereby minimizing creation of transient noise that would otherwise be produced.

22. The method of claim 21, wherein the step of producing the plurality of trigger signals comprises the step of selectively connecting the stored electrical charge to a primary winding of a transformer in response to a light signal that is provided when the periodically varying high voltage is at the peak voltage level.

23. The method of claim 21, wherein the step of developing the stored electrical charge comprises the step of supplying an electrical current to a plurality of capacitors connected generally in a series string, thereby charging each of said capacitors to a different voltage.

24. The method of claim 23, wherein the plurality of capacitors are charged while the trigger capacitor is charged to the peak voltage level.

25. The method of claim 21, wherein the step of applying the trigger signals occurs as often as twice during a cycle of the periodically varying high voltage so that the trigger signals cause the network of solid state switches to conduct bidirectionally.

26. The method of claim 21, further comprising the step of supplying a light signal that causes the trigger signals to be produced, the light signal being conveyed through a generally non-electrically conductive medium, so that a source of the light is signal is electrically isolated from the periodically varying high voltage.

* * * * *

UNITED STATES PATENT AND TRADEMARK OFFICE
CERTIFICATE OF CORRECTION

PATENT NO. : 5,180,963

DATED : January 19, 1993

INVENTOR(S) : M. A. El-Sharkawi et al.

It is certified that error appears in the above-identified patent and that said Letters Patent is hereby corrected as shown below:

| COLUMN | LINE | |
|---|---|---|
| 1 | 9 & 10 | after "invention." delete the sentence "The benefit of the filing dates of which are hereby claimed under 35 U.S.C. § 1.20." |
| 1 | 17 | after "abandoned." insert the sentence "The benefit of the filing dates of which are hereby claimed under 35 U.S.C. § 1.20." |
| 8 | 56 | "Q" should read --$\overline{Q}$-- |
| 12 | 48 | "determined" should read --determine-- |
| 14 | 18 | after "to" insert --output-- |
| 14 | 46 | "optical" should read --optional-- |
| 15 | 24 | after "triggering" insert --bridge-- |
| 29 (Claim 5, | 61 Line 9) | after "electrical" insert --current-- |
| 29 (Claim 5, | 62 Line 10) | after "controlled" insert --rectifier-- |

UNITED STATES PATENT AND TRADEMARK OFFICE
CERTIFICATE OF CORRECTION

PATENT NO. : 5,180,963

DATED : January 19, 1993

INVENTOR(S) : M. A. El-Sharkawi et al.

It is certified that error appears in the above-identified patent and that said Letters Patent is hereby corrected as shown below:

| COLUMN | LINE | |
|---|---|---|
| 32 (Claim 26, | 39 Line 5) | delete "is" (first occurrence) |
| [57] "Abstract" | 14 | "triger" should read --trigger-- |
| [57] "Abstract" | 25 | "gate" should read --gating-- |

Signed and Sealed this

Eighteenth Day of January, 1994

BRUCE LEHMAN

Attest:

Attesting Officer

Commissioner of Patents and Trademarks